US009970747B2

(12) United States Patent
Kreuzer et al.

(10) Patent No.: US 9,970,747 B2
(45) Date of Patent: May 15, 2018

(54) POSITION MEASUREMENT WITH ILLUMINATION PROFILE HAVING TWO DIAMETRICALLY OPPOSED OFF-AXIS RADIATION

(71) Applicants: ASML Netherlands B.V., Veldhoven (NL); ASML Holding N.V., Veldhoven (NL)

(72) Inventors: Justin Lloyd Kreuzer, Trumbull, CT (US); Arie Jeffrey Den Boef, Waalre (NL); Simon Gijsbert Josephus Mathijssen, Den Bosch (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days. days.

(21) Appl. No.: 15/439,833

(22) Filed: Feb. 22, 2017

(65) Prior Publication Data

US 2017/0160075 A1 Jun. 8, 2017

Related U.S. Application Data

(62) Division of application No. 14/391,304, filed as application No. PCT/EP2013/052384 on Feb. 7, 2013, now Pat. No. 9,605,947.

(Continued)

(51) Int. Cl.
*G01B 9/02* (2006.01)
*G01B 11/14* (2006.01)

(Continued)

(52) U.S. Cl.
CPC ............ *G01B 11/14* (2013.01); *G01B 9/0207* (2013.01); *G03F 7/70108* (2013.01);

(Continued)

(58) Field of Classification Search
CPC ..... G01B 11/14; G01B 9/0207; G03F 9/7088; G03F 7/70108; G03F 9/7069; G03F 9/7084
See application file for complete search history.

(56) References Cited

U.S. PATENT DOCUMENTS 6,762,111 B2 7/2004 Fukuda
6,961,116 B2 11/2005 Den Boef et al.

(Continued)

FOREIGN PATENT DOCUMENTS

CN 102402141 A 4/2012
JP 2003-224057 A 8/2003

(Continued)

OTHER PUBLICATIONS

English-Language Abstract for Japanese Patent Publication No. 2004-119663 A, dated Apr. 15, 2004; 1 page.

(Continued)

*Primary Examiner* — Hwa Lee
(74) *Attorney, Agent, or Firm* — Sterne, Kessler, Goldstein & Fox P.L.L.C.

(57) ABSTRACT

An apparatus (AS) measures positions of marks (202) on a lithographic substrate (W). An illumination arrangement (940, 962, 964) provides off-axis radiation from at least first and second regions. The first and second source regions are diametrically opposite one another with respect to an optical axis (O) and are limited in angular extent. The regions may be small spots selected according to a direction of periodicity of a mark being measured, or larger segments. Radiation at a selected pair of source regions can be generated by supplying radiation at a single source feed position to a self-referencing interferometer. A modified half wave plate is positioned downstream of the interferometer, which can be used in the position measuring apparatus. The modified (Continued)

half wave plate has its fast axis in one part arranged at 45° to the fast axis in another part diametrically opposite.

20 Claims, 15 Drawing Sheets

Related U.S. Application Data

(60) Provisional application No. 61/623,391, filed on Apr. 12, 2012.

(51) Int. Cl.
*G03F 7/20* (2006.01)
*G03F 9/00* (2006.01)

(52) U.S. Cl.
CPC .......... *G03F 9/7069* (2013.01); *G03F 9/7084* (2013.01); *G03F 9/7088* (2013.01)

(56) References Cited

U.S. PATENT DOCUMENTS

| | | | |
|---|---|---|---|
| 7,564,534 B2 | 7/2009 | Den Boef et al. | |
| 7,701,577 B2 | 4/2010 | Straaijer et al. | |
| 8,570,487 B2 | 10/2013 | Khuat Duy et al. | |
| 8,593,646 B2 | 11/2013 | Den Boef et al. | |
| 9,605,947 B2 | 3/2017 | Kreuzer et al. | |
| 2002/0109827 A1* | 8/2002 | Nishi | G03F 7/701 355/53 |
| 2005/0117140 A1 | 6/2005 | Mishima | |
| 2006/0061743 A1 | 3/2006 | Den Boef et al. | |
| 2006/0197951 A1 | 9/2006 | Frommer et al. | |
| 2009/0195768 A1 | 8/2009 | Bijnen et al. | |
| 2010/0182589 A1 | 7/2010 | Hirose et al. | |
| 2010/0201963 A1 | 8/2010 | Cramer et al. | |
| 2015/0109624 A1 | 4/2015 | Kreuzer et al. | |

FOREIGN PATENT DOCUMENTS

| | | |
|---|---|---|
| JP | 2004-119633 A | 4/2004 |
| JP | 2008-244448 A | 10/2008 |
| WO | WO 2012/010458 A1 | 1/2012 |

OTHER PUBLICATIONS

International Search Report directed to related International Patent Application No. PCT/EP2013/052384, dated Dec. 20, 2013; 6 pages.

International Preliminary Report on Patentability and Written Opinion of the International Searching Authority directed to related International Parent Application No. PCT/EP2013/052384, dated Oct. 14, 2014; 7 pages.

Notice of Allowance dated Nov. 11, 2016 in U.S. Appl. No. 14/391,304, Kreuzer et al., filed Oct. 8, 2014; 11 pages.

* cited by examiner (1) (2) (3) (4)

Y X (b)

POSITION MEASUREMENT WITH ILLUMINATION PROFILE HAVING TWO DIAMETRICALLY OPPOSED OFF-AXIS RADIATION

This application incorporates by reference in their entireties U.S. patent application Ser. No. 14/391,304, filed Oct. 8, 2014, Int'l Application No. PCT/EP2013/052384, filed Feb. 7, 2013 and U.S. Provisional Application 61/623,391, filed Apr. 12, 2012.

FIELD

The present invention relates to position measurement method and apparatus. The method and apparatus can be use for measuring the positions of marks on a substrate. The invention in other aspects provides a lithographic apparatus and device manufacturing method, and also an optical element.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment sensors by which positions of marks on a substrate must be measured accurately. These alignment sensors are effectively position measuring apparatuses. Different types of marks and different types of alignment sensors are known from different times and different manufacturers. A type of sensor widely used in current lithographic apparatus is based on a self-referencing interferometer as described in U.S. Pat. No. 6,961,116 (den Boef et al). Generally marks are measured separately to obtain X- and Y-positions. A combined X- and Y-measurement can be performed using the techniques described in published patent application US 2009/195768 A (Bijnen et al), however. The contents of both of these applications are incorporated herein by reference.

There is continually a need to provide more accurate position measurements, especially to control overlay error as product features get smaller and smaller. For this purpose, it is considered to reduce the pitch of grating lines used in the alignment marks. At the same time, this creates a need for new instruments and potentially disrupts the existing know-how and infrastructure. Any new sensor should be compatible with and accurate in use with existing types of marks, not just new marks. The processing requirements of the new sensor should not compromise performance in terms of throughput.

SUMMARY

It is an aim of the invention in a first aspect to provide a position measurement apparatus, for example an alignment sensor in a lithographic apparatus, that is compatible with reduced pitch marks and conventional marks, and that does not require radical redesign of the apparatus.

The invention in a first aspect provides a method of measuring a position of a mark on a substrate, the mark comprising features periodic in at least a first direction, the method comprising:

illuminating the mark with a spot of radiation via an objective lens and receiving radiation diffracted by the mark via the same objective lens;

processing the diffracted radiation in a self-referencing interferometer;

detecting variations in an intensity of radiation output by the interferometer while scanning the mark with the spot of radiation; and calculating from the detected variations a position of the mark in at least a first direction of measurement, wherein said spot of radiation is formed using radiation from source regions confined to a peripheral portion within a pupil of said objective lens, said source regions comprising at least first and second regions diametrically opposite one another with respect to an optical axis of the objective lens and being limited in angular extent with respect to said optical axis.

The invention in a second aspect provides an apparatus for measuring positions of marks on a substrate, the apparatus comprising:

an illumination arrangement for supplying radiation with a predetermined illumination profile across a pupil of the apparatus;

an objective lens for forming a spot of radiation on a mark using radiation supplied by said illumination arrangement while scanning said spot of radiation across the mark in a scanning direction;

a self-referencing interferometer for processing radiation that is diffracted by the mark and re-enters said objective lens; and a detection arrangement for detecting variations in an intensity of radiation output by the interferometer during said scanning and for calculating from the detected variations a position of the mark in at least a first direction of measurement, wherein for measuring a position of a mark comprising features periodic in at least a first direction, said illumination profile contains radiation from source regions confined to a peripheral portion within a pupil of said objective lens, said source regions comprising at least first and second regions diametrically opposite one another with respect to an optical axis of the objective lens and being limited in angular extent with respect to said optical axis.

In embodiments of the invention, said first and second source regions may be offset from one another in a direction transverse to said first direction of periodicity of the mark.

A beam splitter having a mirrored portion corresponding to each of said source regions can be used for diverting radiation from said source region into said objective lens, whereby the mirrored portion for each source region serves also to stop radiation from the diametrically opposite source region entering the interferometer after zero order reflection from the mark.

In some embodiments, the illumination arrangement includes a second self-referencing interferometer arranged for generating coherent radiation at said first and second source regions from radiation supplied to the second interferometer at a single source feed position, said first and second source regions being determined by said source feed position. The second self-referencing interferometer may have one or more optical elements in common with the self-referencing interferometer used in the processing step (i.e. light from both interferometers can go through the same optical elements or even all optical elements used). This optical arrangement for generating two coherent sources symmetrically about an optical axis may be claimed and used in other technical areas, not limited to alignment sensors or to lithographic apparatus.

In such an embodiment, said illumination arrangement may further comprise a device for adjusting a polarization of the radiation at one of said regions to match the polarization at the other position, when radiation at said first and second source regions emerges from said second interferometer with different polarizations. Said device may comprise a modified half wave plate whose fast axis is oriented differently in portions corresponding to said first and second source regions of the pupil. Said modified half may have a fast axis parallel to a principal axis of the second interferometer in a first portion and has a fast axis at 45 degrees to said principal axis in a second portion, said first and second portions being positioned diametrically opposite one another with respect to the optical axis.

The invention in a third aspect provides an optical element for selectively adjusting a polarization of radiation at different positions in a pupil of an optical system, said element comprising effectively a half wave plate having its fast axis oriented differently in different regions of said pupil. Said first and second portions of said modified half wave plate may cover respective halves of the pupil, with a boundary between said halves being positioned so as not to interfere with said source regions.

The invention further provides a lithographic apparatus arranged to transfer a pattern from a patterning device onto a substrate, the apparatus comprising a substrate table constructed to hold a substrate and an alignment sensor for measuring the positions of marks on the substrate relative to a reference frame of the lithographic apparatus, wherein the alignment sensor comprises a measuring apparatus according to the second aspect of the invention as set forth above.

The invention yet further provides a method of manufacturing a device in which a lithographic process is used to transfer a pattern from a patterning device onto a substrate, and wherein the transfer of a pattern onto the substrate is controlled by reference to positions of marks on the substrate measured using a method according to the invention, as set forth above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
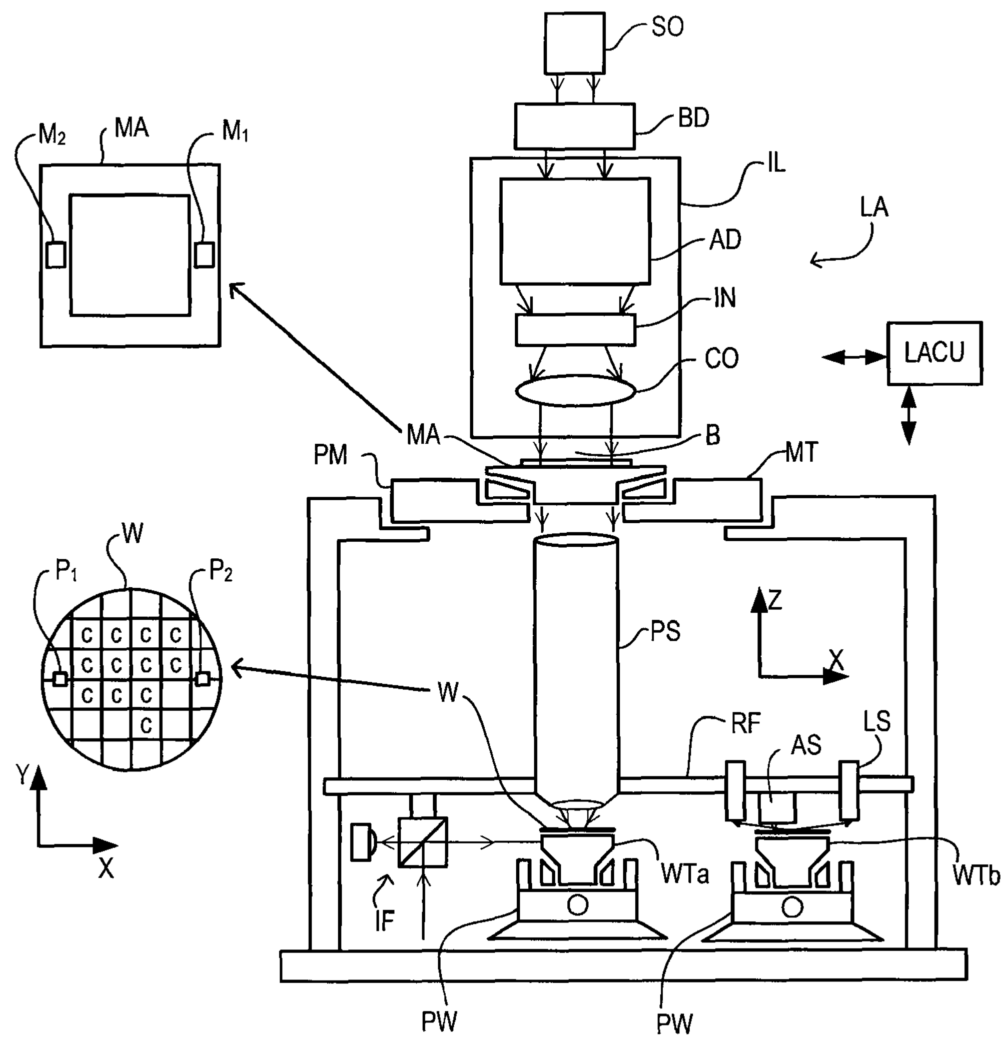
FIG. 1 depicts an exemplary lithographic apparatus including an alignment sensor forming measuring apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribelane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
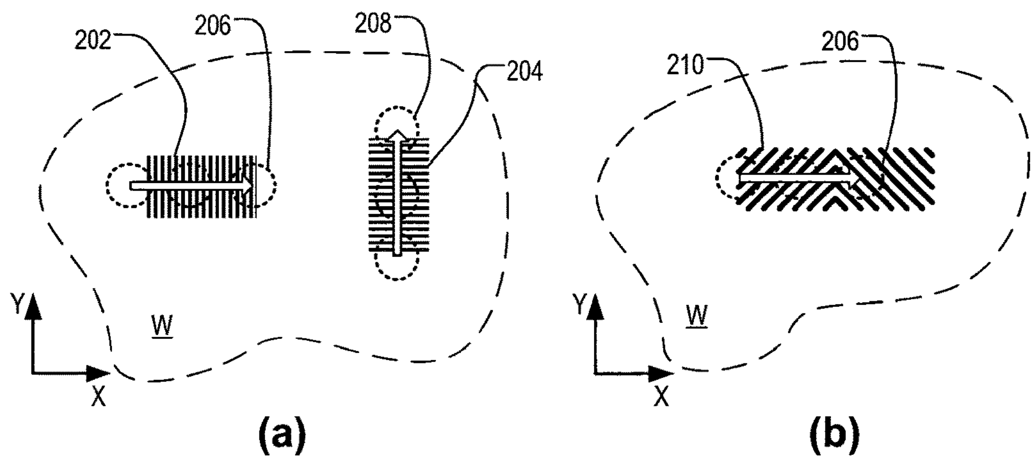
FIG. 2, comprising FIG. 2(*a*) and FIG. 2(*b*), illustrates various forms of an alignment mark that may be provided on a substrate in the apparatus of FIG. 1.

FIG. 2(*a*) shows examples of alignment marks 202, 204, provided on substrate W for the measurement of X-position and Y-position, respectively. Each mark in this example comprises a series of bars formed in a product layer or other layer applied to or etched into the substrate. The bars are regularly spaced and act as grating lines so that the mark can be regarded as a diffraction grating with a well-known spatial period (pitch). The bars on the X-direction mark 202 are parallel to the Y-axis to provide periodicity in the X direction, while the bars of the Y-direction mark 204 are parallel to the X-axis to provide periodicity in the Y direction. The alignment sensor AS (shown in FIG. 1) scans each mark optically with a spot 206, 208 of radiation, to obtain a periodically-varying signal, such as a sine wave. The phase of this signal is analyzed, to measure the position of the mark, and hence of substrate W, relative to the alignment sensor, which in turn is fixed relative to the reference frame RF of the apparatus. The scanning movement is indicated schematically by a broad arrow, with progressive positions of the spot 206 or 208 indicated in dotted outline. The pitch of the bars (grating lines) in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of a repeating signal to be accurately measured.

Coarse and fine marks may be provided, so that the alignment sensor can distinguish between different cycles of the periodic signal, as well as the exact position (phase) within a cycle. Marks of different pitches can also be used for this purpose. These techniques are again well known to the person skilled in the art, and will not be detailed herein. The design and operation of such sensors is well known in the art, and each lithographic apparatus may have its own design of sensor. For the purpose of the present description, it will be assumed that the alignment sensor AS is generally of the form described in U.S. Pat. No. 6,961,116 (den Boef et al). FIG. 2(*b*) shows a modified mark for use with a similar alignment system, which X- and Y-positions can be obtained through a single optical scan with the illumination spot 206. The mark 210 has bars arranged at 45 degrees to both the X- and Y-axes. This combined X- and Y-measurement can be performed using the techniques described in published patent application US 2009/195768 A (Bijnen et al), the contents of which are incorporated herein by reference.

Figure 3:
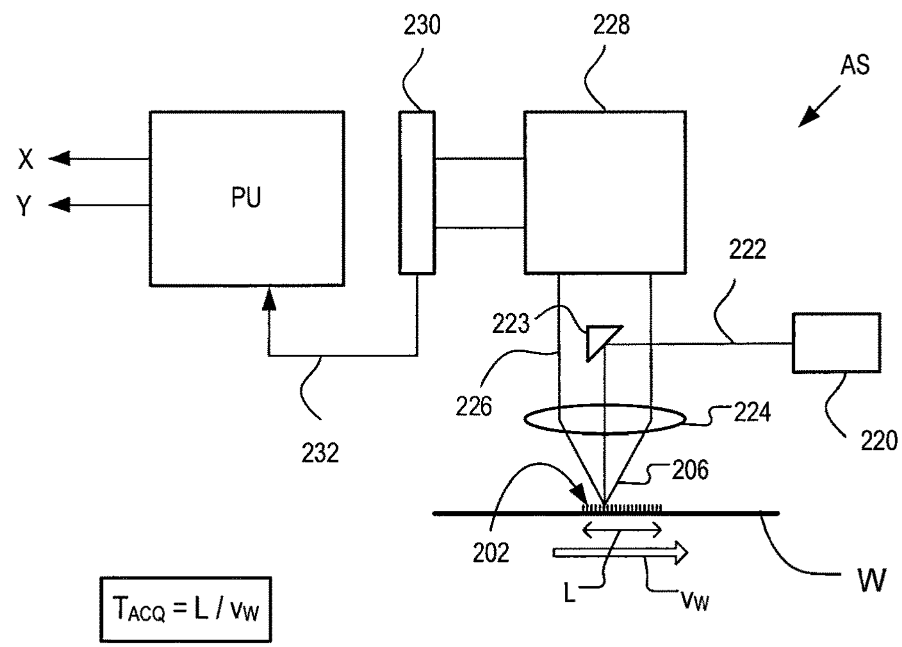
FIG. 3 is a schematic block diagram of a known alignment sensor scanning an alignment mark in the apparatus of FIG. 1.

FIG. 3 is a schematic block diagram of a known alignment sensor AS. Illumination source 220 provides a beam 222 of radiation of one of more wavelengths, which is diverted by a spot mirror 223 through an objective lens 224 onto a mark, such as mark 202, located on substrate W. As indicated schematically in FIG. 2, in the example of the present alignment sensor based on U.S. Pat. No. 6,961,116, mentioned above, the illumination spot 206 by which the mark 202 is illuminated may be slightly smaller in diameter then the width of the mark itself.

Radiation scattered by mark 202 is picked up by objective lens 224 and collimated into an information-carrying beam 226. A self-referencing interferometer 228 is of the type disclosed in US'116, mentioned above and processes beam 226 and outputs separate beams onto a sensor array 230. Spot mirror 223 serves conveniently as a zero order stop at this point, so that the information carrying beam 226 comprises only higher order diffracted radiation from the mark 202 (this is not essential to the measurement, but improves signal to noise ratios). Intensity signals 232 from individual sensors in sensor grid 230 are provided to a processing unit PU. By a combination of the optical processing in the block 228 and the computational processing in the unit PU, values for X- and Y-position on the substrate relative to the reference frame RF are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

As mentioned already, a single measurement of the type illustrated only fixes the position of the mark within a certain range corresponding to one pitch of the mark. Coarser measurement techniques are used in conjunction with this to identify which period of the sine wave is the one containing the marked position. The same process at coarse and/or fine level can be repeated at different wavelengths for increased accuracy, and for robust detection of the mark irrespective of the materials from which the mark is made, and on which it sits. The wavelengths can be multiplexed and demultiplexed optically so as to be processed simultaneously, and/or they may be multiplexed by time division or frequency division. Examples in the present disclosure will refer to one measurement at one wavelength only, and the skilled reader can readily appreciate the modifications required to expand that teaching to provide a practical and robust measurement apparatus (alignment sensor).

Referring to the measurement process in more detail, an arrow labeled vW in FIG. 3 illustrates a scanning velocity with which spot 206 traverses the length L of mark 202. In this example, the alignment sensor AS and spot 206 in reality remain stationary, while it is the substrate W that moves with velocity vW. The alignment sensor can thus be mounted rigidly and accurately to the reference frame RF (FIG. 1), while effectively scanning the mark 202 in a direction opposite to the direction of movement of substrate W. The substrate is controlled in this movement by its mounting on the substrate table WT and the substrate positioning system PW.

As discussed in the prior patent application U.S. Ser. No. 13/369,614, not published at the present priority date, the high productivity requirements required of the lithographic apparatus require the measurement of the alignment marks at numerous positions on the substrate to be performed as quickly as possible, which implies that the scanning velocity vW is fast, and the time TACQ available for acquisition of each mark position is correspondingly short. In simplistic terms, the formula TACQ=L/vW applies. The prior application U.S. Ser. No. 13/369,614 describes a technique to impart an opposite scanning motion of the spot, so as to lengthen the acquisition time. The same scanning spot techniques can be applied in sensors and methods of the type newly disclosed herein, if desired.

There is interest in aligning on marks with smaller grating pitches. Overlay in real production is generally significantly larger than under test conditions. Investigations suggest this is due to the alignment marks on product wafers becoming asymmetric during processing. Reducing the pitch of the alignment marks decreases the effect of asymmetry on the measured alignment position.

The skilled person knows that some options to reduce the pitch of an alignment grating are (i) shortening the wavelength of radiation used, (ii) increasing the NA of the alignment sensor optics and (iii) using off-axis illumination. A shorter wavelength is not always possible since alignment gratings are often located underneath an absorbing film (e.g. amorphous carbon hardmask). Increasing the NA is in general possible but is not preferred since there is a need for a compact objective with a safe distance from the wafer. Therefore using off-axis illumination is attractive.

Position Measurement with Segmented Illumination Profile

Figure 4:
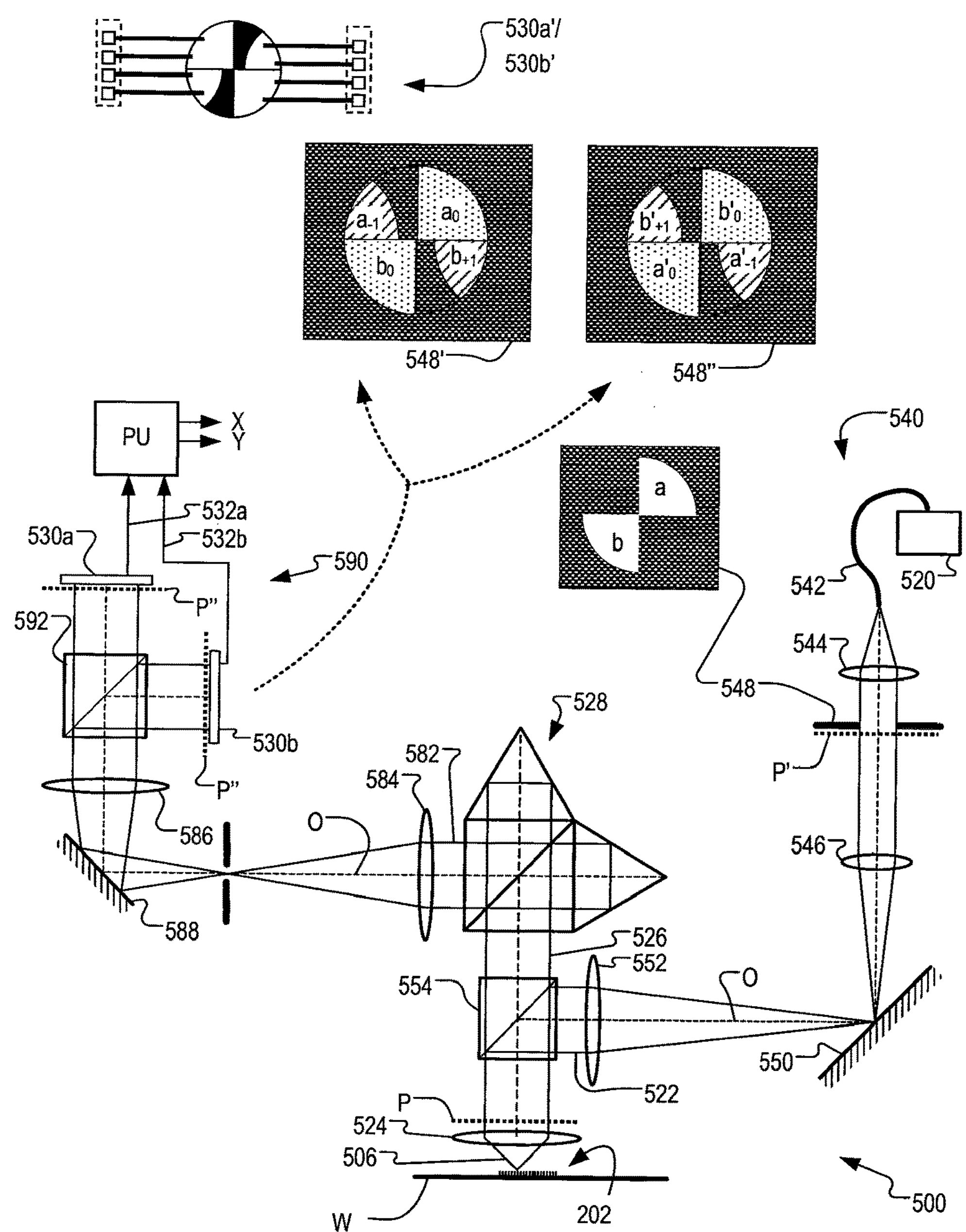
FIG. 4 is a more detailed exemplary schematic diagram showing the optical system of a modified alignment sensor using a segmented illumination profile.

FIG. 4 illustrates an optical system 500 of an alignment sensor that is described in the prior publication, U.S. Pat. No. 6,961,116, mentioned above. This introduces a particular segmented illumination mode which, among other things, allows a reduced pitch of alignment mark for greater accuracy, and which allows scatterometry type measurements to be performed with the alignment sensor, rather than with a separate scatterometer instrument. A further modification can be made based on the disclosure of publication US 2009/195768, also mentioned above, so that simultaneous measurement of X- and Y-position can be performed. For the purpose of the present example, it shall be assumed that measurement of position is performed in one direction only.

For ease of comparison with the schematic diagram of FIG. 3, some parts of the optical system 500 are labeled with reference signs similar to those used in FIG. 3, but with prefix "5" instead of "2". Thus, we see a light source 520, an illumination beam 522, an objective lens 524, an information carrying beam 526, a self-referencing interferometer 528 and detectors 530*a* and 530*b*. Signals 532*a* and 532*b* from these detectors are processed by processing unit PU, which is modified as appropriate to implement the novel features described below. An optical axis O which has several branches is indicated by a broken line running throughout the optical system 500. Additional components illustrated in this more detailed schematic diagram are as follows. In an illumination subsystem 540, radiation from source 520 is delivered via an optical fiber 542 to a point where it enters an optical system comprising lenses 544 and 546. Of course, where each lens is illustrated schematically by a single element, a practical embodiment may include groups of elements in practice. Reflective optical elements may also be used. Between lenses 544 and 546, the beam formed by radiation from the source is parallel, and passes through a plane P', which is a back-projection of the pupil plane P of objective lens 524. A fixed or configurable illumination aperture 548 is provided in this plane, to allow specific modes of illumination, such as the symmetric, segmented illumination pattern illustrated in FIG. 5(*j*). Two diametrically opposite quadrants, labeled a and b, are bright in this aperture pattern (transparent), while the other two quadrants are dark (opaque). This type of aperture is known in scatterometry apparatus, from the published patent application US 2010/201963. The merits of this modified illumination aperture will be described further below. After diffraction by a fixed mirror 550 and collimation by a lens 552, illumination beam 522 is delivered from the illumination subsystem 540 to a beam splitter 554, which separates the illumination beam 522 from the information-carrying beam 526, that travels to and from the substrate W directly through objective 524.

Referring now to the processing of information-carrying beam 526, this passes into the self-referencing interferometer 528 in the same manner as the known alignment sensor of U.S. Pat. No. 6,961,116. Interferometer 528 is shown in a simplified, two-dimensional arrangement, but in fact it comprises a three-dimensional arrangement of prisms and other elements, as described in that prior patent. Similarly, polarizing elements that are part of the interferometer are omitted here, for clarity. The function of self-referencing interferometer 528, as in the known example, is to receive the information-carrying beam 526, to split it into two equal parts, to rotate these parts by 180° relative to one another, and combine these parts again into an outgoing beam 582. Further lenses 584 and 586 together with a fixed deflecting mirror 588, deliver this beam to a detection subsystem 590 comprising a polarizing beam splitter 592 and detectors 530*a* and 530*b*.

Beam splitter 592 produces two interference patterns that are in anti-phase with each other. Thus, if the interferometer 528 produces destructive interference at one point on detector 530*a*, there will be constructive interference at the corresponding point on the detector 530*b*. By subtracting the signals from the two detectors 530*a* and 530*b*, one can reduce the influence of common-mode intensity noise, and so obtain a more accurate output from the alignment sensor as a whole.

Whereas, in the known alignment sensor of FIG. 3, detectors 230 are placed in an image plane corresponding to the plane of substrate W, the detectors 530*a* and 530*b* in the modified optical system 500 are positioned in a plane P", which is conjugate with the pupil plane P of objective 524. Each detector 530*a* and 530*b* may be an image sensor, for example a CCD camera sensor. Alternatively, individual point detectors may be deployed instead of image sensors, as shown in the inset detail labeled 530*a*'/530*b*'. In either case, the radiation field at plane P" is not an image of the substrate, but a diffraction spectrum of the mark 202, conjugated with the illumination aperture 548. In this type of detection system, the alignment signals required to obtain positional information of the mark 202 can still be obtained, but additionally the pupil plane images detected by detectors 530*a* and 530*b* can be used to analyze additional properties of the mark or other features on substrate W, to perform scatterometry. For example, asymmetry of alignment and/or overlay targets can be analyzed, which facilitates measurement of overlay error between device layers, for example.

As described in the unpublished prior application U.S. Ser. No. 13/369,614, a benefit of using the alignment sensor to measure target asymmetry, rather than a separate instrument, is that positioning errors between the alignment sensor and the overlay measurement apparatus are eliminated. Another benefit is that information on asymmetry in the marks can be used to improve accuracy in the position measurements made using the sensor. This is because asymmetry can introduce systematic errors in the reported position, that can be corrected using knowledge of the asymmetry and a suitable formula.

Figure 5:
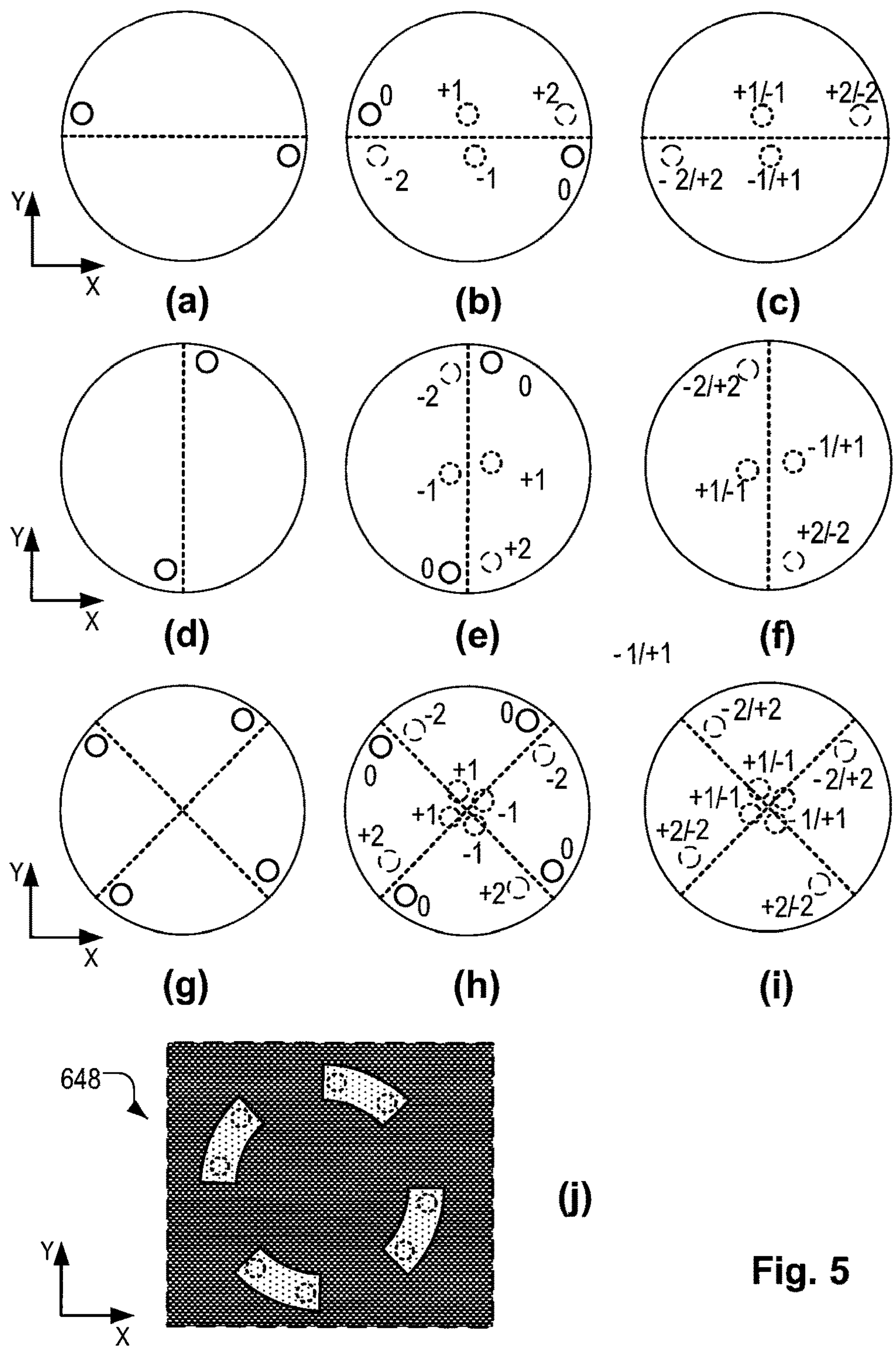
FIG. 5 illustrates various off-axis illumination profiles, resulting diffraction signals, and resulting self-referencing interferometer output in novel position measuring apparatuses forming embodiments of the present invention and useable as the alignment sensor in the apparatus of FIG. 1.

While the illumination pattern provided by aperture 548 has bright quadrants labeled a and b in FIG. 5, the diffraction pattern resulting from diffraction by the lines of the alignment mark 202 in a given direction is represented by the pattern at 548'. In this pattern, in addition to zero order reflections labeled a0 and b0 there are first order diffraction signals visible, labeled a−1, a+1, b−1 and b+1. Because other quadrants of the illumination aperture are dark, and more generally because the illumination pattern has 180° rotational symmetry, the diffraction orders a−1 and b+1 are "free" meaning that they do not overlap with the zero order or higher order signals from other parts of the illumination aperture. This property of the segmented illumination pattern can be exploited to obtain clear first order signals from a diffraction grating (alignment mark) having a pitch which is half the minimum pitch that could be imaged if a conventional, circularly-symmetric illumination aperture were used. This diffraction pattern 548' and the manner in which it can be exploited for scatterometry, are described in the known application US 2010/201963. In the interferometer 528 of the alignment sensor optical system 500, a 180° rotated copy of the diffraction pattern 548', illustrated and labeled 548" in FIG. 5, is also formed and mixed with pattern 548'. These patterns will interfere with each other during the scanning of the alignment mark 202, so as to provide the position signal.

Compared with the sensor of US'116 which is in wide use commercially, the modified sensor of FIG. 4 requires not only a change of aperture 548, but a completely different detection arrangement downstream of interferometer 528. Whereas the known alignment sensor can simply integrate the entire light field into a single intensity value, the intensities in planes P" need to be spatially resolved to separate the higher order signals that are present in different parts of the pupil plane image, and to ignore the zero order signals. The redesign of the detection optics reduces compatibility with existing designs. In a version where sensors 530*a* and 530*b* are image sensors, it is complicated and expensive to provide the sensors & electronics with the performance levels required to maintain throughput. Where the detectors 530*a*' and 530*b*' are used which collect radiation at only certain points in the area of the pupil image plane P" the optical system still has to be redesigned to provide spatial resolution at the detector. Sampling the intensity only at certain locations also implies that a lot of light is discarded, reducing accuracy and/or speed of operation, or requiring a more costly detector. Moreover, because the operation of the FIG. 4 apparatus combines radiation incident on the mark from a wide range of incident angles, each experiencing a slightly different sensor aberration, the overall measurement results are more sensitive to process variations. Additionally, while the segmented illumination profile is suitable for reduced-pitch marks, it is not suitable for coarse pitch marks, as currently used. This is because the various higher orders +1, +2 etc. for a coarse pitch mark lie closer together and begin to overlap. Consequently, to use the segmented aperture in practice would require mechanical arrangements to be put in place to swap out the aperture when measuring the conventional marks.

In the examples that will now be described with reference to FIG. 5 onward, alignment sensors (more generally, position measuring apparatuses) are shown which allow the use of reduced grating pitches without the need for spatial resolution on the detector side. By use of novel illumination modes, these apparatuses are able to measure the positions of marks with a wide range of different pitches, for example from less than 1 μm to pitches of 20 micron, without changing the current detector design and without changing the illumination profile.

A first feature common to the examples to be described is use of off-axis illumination at a limited range of incidence angles (limited radial extent in the pupil plane). By off-axis illumination, it is meant that source regions of radiation are confined to a peripheral portion of the pupil, that is to say, some distance away from the optical axis. Confining the illumination to an extreme periphery of the pupil reduces the smallest possible pitch of the alignment mark from substantially λ/NA to substantially λ/2NA, where λ is the wavelength of radiation used, and NA is the numerical aperture of an objective lens of the instrument (e.g. the alignment sensor or more generally the position measuring apparatus). The examples to be described also use a particular distribution of spot mirrors in a beam splitter of the apparatus, which can both provide the desired illumination and act as a field stop for zero order diffracted radiation. A 'universal' illumination profile can be designed that allows for aligning on any of the X, Y and XY marks without changing the illumination mode, although this inevitably brings some compromise in performance and/or some complication in the apparatus. Alternatively, dedicated modes can be designed and made to be selectable for use with the different mark types. Different polarizations of illumination can be selected also.

In all of the profiles to be described, the illumination profile is such as to supply coherent radiation from at least first and second source regions within a pupil of the objective lens. The first and second regions are confined to a peripheral portion of said pupil (in the sense of at least being away from the optical axis). They are each limited in angular extent and are positioned diametrically opposite one another with respect to the optical axis. As will be seen from the examples, the source regions may take the form of very small spots, or may be more extended in form. Further source regions may be provided, in particular third and fourth source regions may be provided rotated at 90° from the first and second regions. The apparatus as a whole need not be limited to providing these particular illumination profiles. It may have other modes of use, both known or yet to be developed, which favor the use of different profiles. An example would be an on-axis illumination profile, for compatibility with existing marks and measurement methods.

Figure 6:
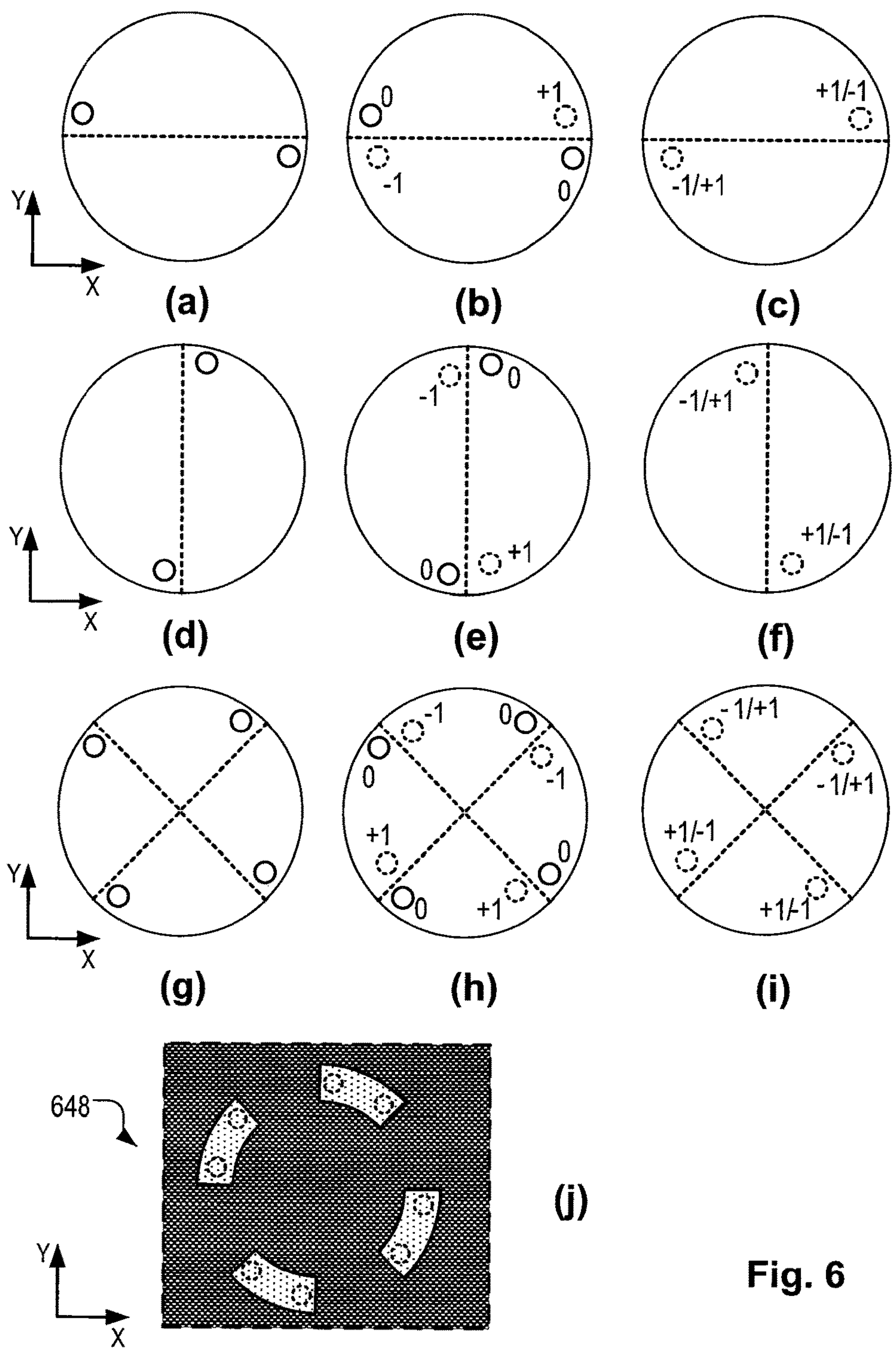
FIG. 6 illustrates, similar to FIG. 5, various off-axis illumination profiles, resulting diffraction signals, and resulting self-referencing interferometer output with a reduced-pitch mark.

Referring firstly to FIGS. 5 and 6, we discuss selection of off-axis illumination modes for the different mark types shown in FIGS. 2(*a*) and (*b*). In the known sensor of FIG. 3, by using illumination normal to the substrate, diffraction spots occurring in any direction (X, Y and XY) will fall safely within the pupil of the optical system, so long as the grating pitch is λ/NA or less. An alignment signal can be extracted when the +n order is overlapping with the −n order. This is done using the self-referencing interferometer 228. When we would like to use off-axis illumination, as in the present invention, all 3 grating directions should be supported, either in a single illumination mode, or by modes which are readily selectable in the hardware.

FIG. 5 shows schematically (a) a desired off-axis illumination profile, (b) the resulting diffraction spots and (c) a pupil plane image desired after the interferometer for a mark with X-axis orientation (202 in FIG. 2(*a*)). The mark in FIG. 5 has a pitch compatible with the known alignment sensors. The circle in each diagram represents the pupil of the optical system, while the direction of periodicity in the mark is represented by the dotted line crossing the circle. In (a), two spots of illumination are positioned diametrically opposite one another, providing the illumination profile with 180° symmetry about the optical axis (O, not shown). (The skilled reader will understand that these spots exist in the pupil plane and are not to be confused with the spot on the mark itself, or in an image of the mark. On the other hand, 180° in the pupil plane is equivalent to 180° rotation in the image plane also.) The spots are not positioned on the X axis (dotted line), but rather offset from it by a small angle. Consequently, the spots are offset from one another in a direction transverse to the X axis, that is to say, transverse to the direction of periodicity of the grating. At (b) we see the resulting diffraction pattern caused by the grating of the alignment mark 202. For one spot, the diffraction orders +1 and +2 are within the pupil. For the other spot, the diffraction orders −1 and −2 are within the pupil, at positions 180° rotated from the orders +1 and +2. A zero order diffraction (specular reflection) of each spot coincides exactly with the position of the other spot.

Because of the offset mentioned already, the diffraction orders of each spot remain separate from those of the other spot, irrespective of the pitch of the grating. An apparatus can be envisaged in which the offset is not present, and the illumination spots lie exactly on the X, Y and/or XY axes. However such an arrangement places many constraints on the combinations of mark pitches and radiation wavelengths that can be used, if one is to avoid unwanted overlaps between diffraction orders, and to avoid wanted diffraction orders being blocked. In embodiments where broadband or polychromatic radiation is used, the higher order diffraction signals will not be a single spot, as shown here, but rather will be spread into a first order spectrum, second order spectrum and so forth. The potential for unwanted overlaps between orders is thereby greater. The orders will be represented as spots here for simplicity only.

FIG. 5 (*c*) shows the result of passing the diffraction signal at (b) through an interferometer that mixes 180°-rotated copies of the mark image. It is assumed that the 0 order spots are blocked by a field stop. A simple implementation of such a field stop will be described in the examples below. The positive and negative signals for each higher order are superimposed and become mixed as indicated by +1/−1, +2/−2 etc. Provided that the original illumination spots are coherent with one another, the effect is the same as the mixing of positive and negative orders of a single illumination spot. Accordingly the interferometer, detection optics and detection electronics of the position measuring apparatus can be the same as in the known apparatus of FIG. 3.

FIGS. 6 (*a*), (*b*) and (*c*) show the corresponding illumination profile, diffraction pattern and interferometer output for an X-direction mark having half the pitch of the mark used in FIG. 5. In this instance, only the orders +1 and −1 fall within the pupil, but this is sufficient for recognition of the mark position, and represents a lower limit for the grating pitch that is substantially λ/2NA, i.e. half what applied in the known instrument.

In FIGS. 5 and 6, parts (d), (e) and (f) show similarly the illumination profile, diffraction pattern and interferometer output for an illumination mode designed for a Y-direction mark (204 in FIG. 2(*a*)). Everything that has been said above with respect to parts (a), (b) and (c) of FIGS. 5 and 6 applies equally to these parts.

In FIGS. 5 and 6, parts (g), (h) and (i) show illumination profiles for an XY mark (210 in FIG. 2(*b*)). Because the mark has portions with different orientations of grating lines, each at 45° to the X and Y axes, two pairs of spots are provided in the illumination profile. As in the X and Y cases, the spots of each pair are positioned diametrically opposite one another, and slightly offset from one another in a direction transverse to the direction of periodicity of the grating. Note that the two pairs of spots do not need to be present at the same time when scanning the XY mark: each pair can be switched on for scanning the portion of the mark that has the corresponding direction of periodicity. Even if both pairs of spots are illuminated simultaneously, the diffraction orders received by the objective from the substrate will be only those corresponding to the direction of periodicity in the part of the mark being scanned. The spots shown at (g), (h) and (i) therefore are a combination of the illumination and diffraction signals from both parts of the XY mark.

It will be clear from FIGS. 5 and 6 that the ideal illumination profile to allow a minimum pitch is different for all three mark types. In examples to be described further below with reference to FIG. 11 onward, the illumination system is configured to provide substantially these ideal illumination modes, selectable according to the mark type. Before describing that system, the examples of FIGS. 7 to 10 are described, for which we construct a multi-purpose illumination profile that suits all three grating directions, with certain compromises.

Parts (j) in FIGS. 5 and 6 depict the multi-purpose illumination profile 648 just mentioned. Compared with the profile 548 shown in FIG. 4, profile 648 comprises four illuminated segments, rather than two. Further, each segment is limited in radial extent, and lies only in a peripheral portion of the pupil. For example, each segment may have a radial extent that is less than 10% or even less than 5% of the radial extent of the pupil. (From this it will be appreciated that the drawing is not to scale.) In absolute terms, the radial extent of the illumination may be less than 1 millimeter, for example around 0.5 mm, while a pupil size may be on the order of 1 to 3 cm. Each segment may be confined to a peripheral portion of the pupil that lies further than 0.5, 0.6, 0.7, 0.8 or 0.9 of the radius of the pupil from the optical axis (Z axis). The segments in this example can be described as part-annular, and each subtends an angle of 45° about the optical axis, or slightly less. Each segment therefore has a limited angular extent, compared with the quadrants of illumination shown in FIG. 4 which each subtend 90°. As indicated by the small circles in parts (j) of FIGS. 5 and 6, these four segments encompass all of the illumination spot positions that are shown in parts (a), (d) and (g) of FIGS. 5 and 6, confirming that all of the mark types can be suitably illuminated with the same 'universal' illumination profile.

The illumination profile of part (j) of FIG. 5 can be produced in a number of ways to form a practical instrument, bearing in mind that the opposed segments should be coherent for the interferometer 528 to produce the desired signal. Particularly when a broadband source is involved, the coherence length/time of the source radiation will be very short. Even with a monochromatic laser source, US'116 teaches that a short coherence time is preferred, for example to eliminate interference from multiple reflections. Consequently, optical path lengths from the source to each segment should be very closely matched. An aperture corresponding directly to the desired profile could be placed in a widened parallel beam, but that would result in a relatively large light loss. To circumvent the loss of light, we propose various alternative solutions.

Figure 7:
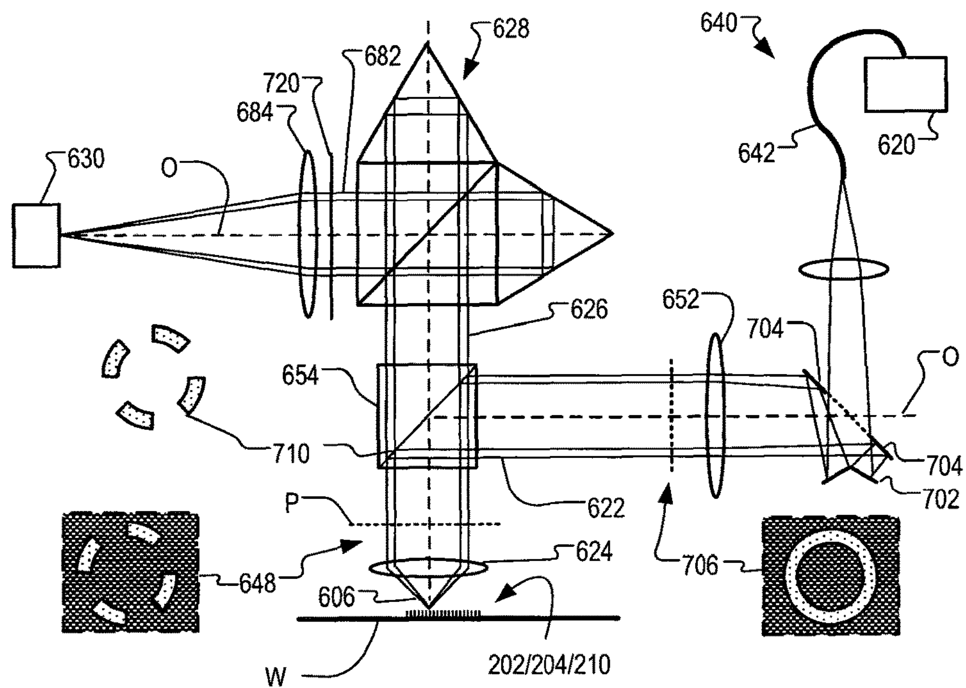
FIGS. 7 and 8 are schematic diagrams of position measuring apparatus implementing off-axis illumination according to first and second embodiments of the present invention.

FIG. 7 illustrates a first example of a measurement apparatus having the illumination profile 648. The reader will recognize many elements carried over from the known alignment sensor and from the example of FIG. 4. The same reference numbers are used, but with the prefix '2' or '5' changed to '6'. Thus an illumination subsystem 640 comprises a radiation source 620 and fiber 642. An input beam 622 is delivered via a lens 652 and beam splitter 654 to an objective lens 624 having a pupil plane P. Objective lens 624 forms a spot 606 on alignment mark 202/204/210 on the wafer W. An information-carrying beam 626 passes through beam splitter 654 to a self-referencing interferometer 628. Interferometer 628 splits the radiation field into two equal parts, rotates these parts by 180° relative to one another, and recombines them into an outgoing beam 682. A lens 684 focuses the entire field onto a detector 630, which is an arrangement similar to the known alignment sensor of FIG. 3. Spatial resolution at detector 630 is not required, although it can be provided, of course for other purposes.

To achieve the desired illumination profile 648 at the entrance to objective 624, the illumination from fiber 642 is delivered to a so-called axicon mirror 702 which gives it an annular distribution. A second mirror 704 which is of a tilted annular form feeds this radiation to lens 652. Consequently, input beam 622 has an annular radiation profile as shown at 706. Within beam splitter 654, discrete mirror segments 710 are formed on its internal interface, in a pattern corresponding to the desired illumination profile 648. In practice, this pattern has to be applied to the interface in a distorted form, so that it appears as shown when viewed from the input and output directions. The radial extent of annular profile 706 matches that of the desired segments 648, reducing radiation loss. However, 50% of the radiation is lost at angular positions where the mirror segments are absent, as it passes straight through the beam splitter.

As a result of the annular profile 706 and the segmented annular mirror 710, the desired illumination profile 648 is achieved. The radial extent of annular profile 706 matches that of the desired segments, reducing radiation loss. However, 50% of the radiation is lost where the mirror segments are absent, as it passes straight through the beam splitter. This is no worse than a conventional half-silvered interface, however, which would be required in the beam splitter 554 of FIG. 4. The segmented mirror performs a second function as a field stop for zero order diffracted radiation. Unlike the spot mirror 223 in the known alignment sensor of FIG. 3, however, each mirror segment cannot serve as its own field stop, because the zero order diffracted radiation is reflected by the target to re-enter the objective lens at an angle 180° opposed to its angle of incidence. However, because the mirror 710 has a pattern with 180° symmetry, each segment of mirror 710 can serve as a field stop blocking the zero order signal for the diametrically opposite segment. In this way, and without any additional components, the zero order signals are removed from the information-carrying beam 626 before it enters interferometer 628. A position signal (variation) can still be extracted without blocking the zero order, but the zero order in that case provides a background intensity (DC component) that constitutes a form of noise.

Figure 8:
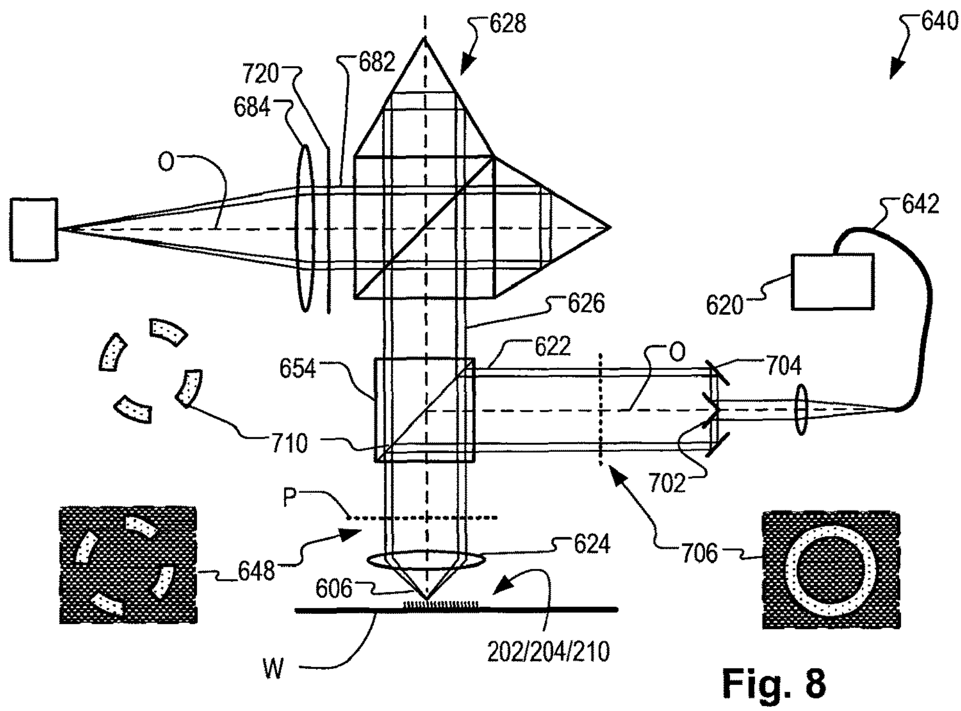

FIG. 8 shows a slightly modified version of the FIG. 7 apparatus, in which the tilted annular mirror 704 is replaced by a frustoconical mirror. In both examples of FIGS. 7 and 8, an axicon lens could be used to achieve a similar effect, but the axicon mirror 702 suffers less from chromic aberration.

Figure 9:
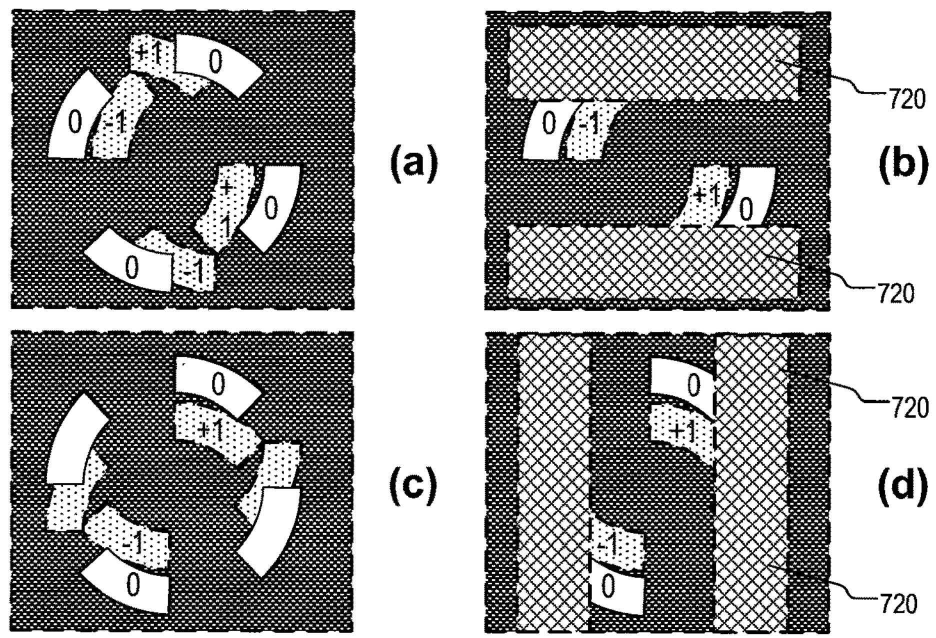
FIG. 9 illustrates the form and function of a rotatable field stop usable in the embodiments of FIGS. 7 and 8.

FIG. 9 illustrates some limitations of the 'compromise' illumination profile 648, and a potential solution. Although a main aim of developing the new position measuring apparatus is to allow measurements using marks with smaller grating pitch, it is important that the new apparatus should also function well with existing marks of wider pitch. FIG. 9 (*a*) shows the diffraction pattern for an X mark having a coarse pitch. We can observe that, depending on the pitch of the mark and the wavelength of the radiation, the −1 order of the bottom quadrant can overlap with the +1 order of the right quadrant. This is an effect we do not want. Furthermore, after the interferometer, the overlapping bottom −1 order and top +1 order, creates an additional interference pattern which is also unwanted due to possible aberrations present in the alignment sensor. Moreover, this diagram shows only the zero and first order, for clarity, when higher orders will be present. The zero orders are blocked by the spot mirrors 710, but for a coarse mark, not only first but also second, third and higher orders might all fall within the pupil, making the additional interference even more complex.

FIG. 9(*b*) shows a solution to this problem of interference. Parts of the pupil are blocked with a field stop 720 as indicated. This field stop can be placed after interferometer 628, as shown for example in FIG. 7, or it can be placed in the information-carrying beam 626 before the interferometer.

FIG. 9(*c*) shows the diffraction pattern for a Y mark with similar coarse pitch. The field stop 720 as shown in FIG. 9(*b*) is rotated 90° (or substituted for a different one) as shown in FIG. 9(*d*). The field stop can thus be adjustable for X, Y and XY marks (blocking top and bottom, left and right and plus or minus 45o respectively). As is noted already in US'116, the alignment and optical quality of a field stop 720 positioned downstream of the interferometer is not particularly critical, as the position information is already encoded in the beam by that point. The rotation of the field stop may be realized in practice by a programmable spatial light modulator, such as an LCD device, with segments that can be made opaque or transparent by electronic control. For the XY mark 210 having two different orientations, the orientation of the field stop will be at 45° to that shown, and may be controlled so as to switch during scanning of the mark.

For small pitch alignment targets these field stops 720 are not necessary, because the higher orders causing the unwanted interference patterns are outside the NA of the objective and thus not present in the pupil plane. Note that the field stops 720 can be omitted in any case, but at the penalty of increased process-sensitivity. This is because a large range of incident angles are used and light with a slightly different incident angle experiences a slightly different sensor aberration.

Figure 10:
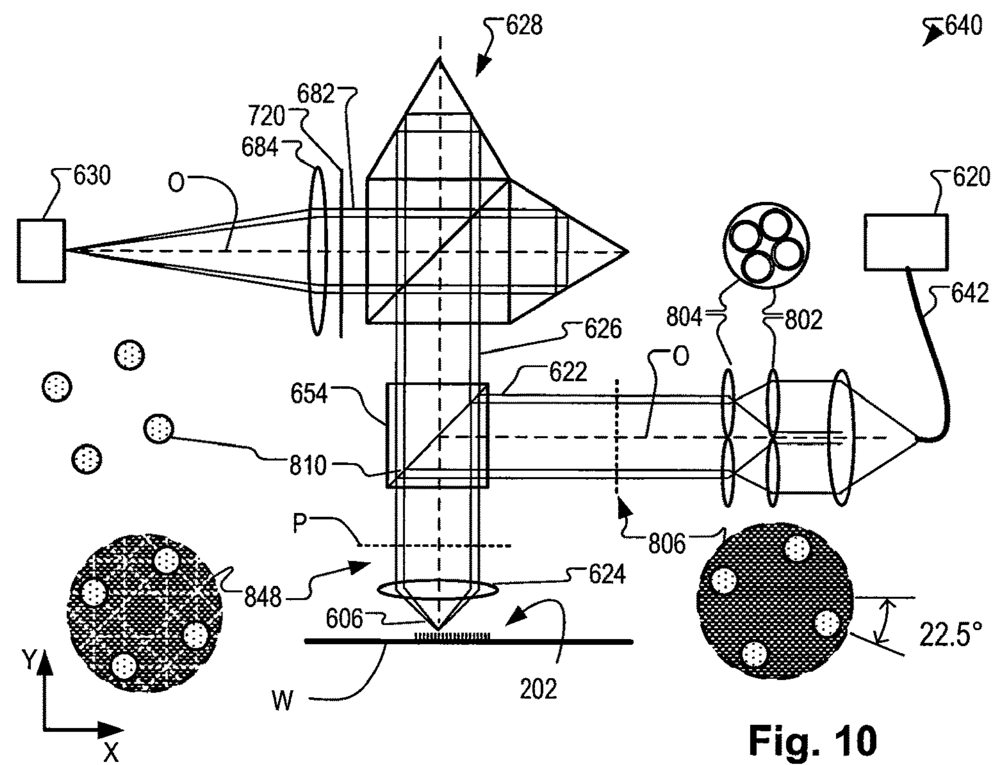
FIG. 10 is a schematic diagram of position measuring apparatus implementing off-axis illumination according to a third embodiment of the invention.

FIG. 10 illustrates another position measuring apparatus using a different 'universal' illumination profile 848. To reduce the angular extent and avoid some of the problems illustrated in FIG. 9(*a*), while also avoiding undue wastage of light, some quadruple lenses 802 and 804 are used to concentrate the incoming radiation into four bright spots, having the profile 806. These spots are matched by spot mirrors 810 to form the desired illumination profile 848 at the pupil plane P of objective lens 624. The spots in the profile 848 are in two pairs, with 180° symmetry in each pair. The pairs are at 90° to one another, and located at 22.5° to the X and Y axes. The spots are smaller than the annular segments of the profile 648, which reduces the risk of interference between orders. The spots have a limited radial extent and a limited angular extent in the pupil plane. For example, each spot may have a radial extent that is less than 20%, less than 10% or even less than 5% of the radial extent of the pupil. (From this it will be appreciated that the spots in the drawing are not to scale.) In absolute terms, the radial extent of the illumination may be less than 1 millimeter, for example around 0.5 mm, while a pupil size may be on the order of 1 to 5 cm. Each spot is off the optical axis, and may lie further than 0.5, 0.6, 0.7, 0.8 or 0.9 of the radius of the pupil from the optical axis (Z axis). The angular extent of each spot may be less 10° or less than 5°.

The directions in which the higher order spots will be found in the diffracted radiation field are indicated for the X, Y and XY marks by white dotted lines on the profile 848. The illumination profile 806 again has the properties: (i) each spot is limited in radial and angular extent and (ii) within each spot pair the spots are offset from one another in a direction transverse to any of the directions of periodicity of the X, Y or XY marks. Accordingly, higher order spots lying along these diffraction directions will not interfere with one another, at least in the middle part of the field. Adjustable field stop 720 can be provided as in the previous examples, particularly where coarse marks are being measured.

The examples described above with references to FIGS. 5 to 10 have the benefit that one can leave the detector side of the current alignment sensor as it is, while adding capability to measure smaller pitched alignment marks with a limited loss of light (approximately a factor 4). The FIG. 10 arrangement is a little compromised in terms of smallest pitch, because the illuminating spots are not at such extreme positions with respect to the directions of periodicity. Having said that, it still possible to perform pupil based detection by using a detector array. One advantage of that is that one can perform angle-resolved scatterometry with the alignment sensor. Although a specialized scatterometer may perform such measurement better, for example with a wider range of incoming angles, there are also benefits to being able to make such measurements using the alignment sensor hardware present in the lithography tool, rather than in a separate metrology tool.

Finally, it should be noted that in the examples shown in FIGS. 4, 7, 8 and 10 above we have omitted out some polarizing elements that are required in practice around the interferometer. This is only done to simplify the explanation of this idea. In a real implementation they need to be included. Additionally, it is customary to make measurements with different polarizations according to the mark type, and/or to make measurements with more than one polarization on each mark. The features to achieve desired polarizations can readily be envisaged by the skilled person.

Figure 11:
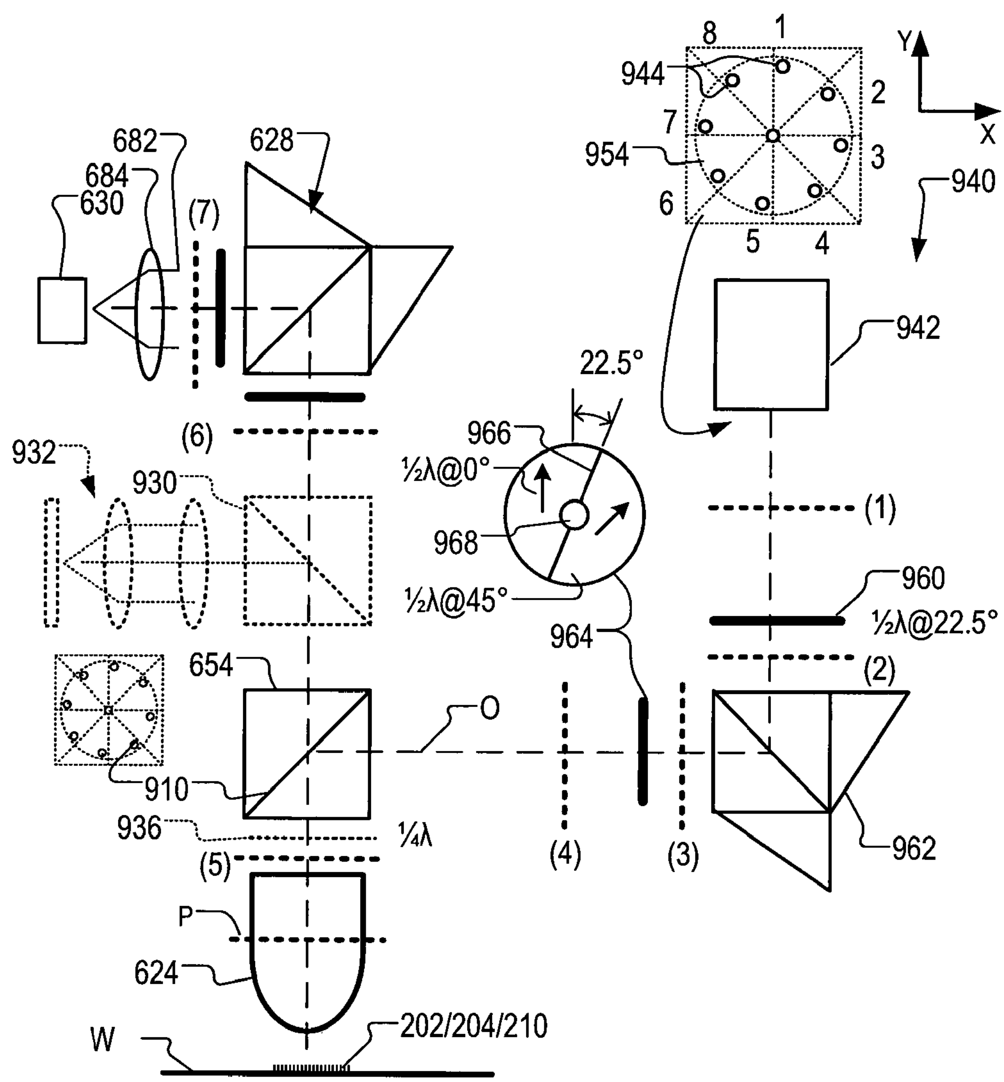
FIG. 11 is a schematic diagram of a position measuring apparatus implementing off-axis illumination according to a fourth embodiment of the invention.

FIG. 11 onward describe examples of position measuring apparatuses based on the illumination patterns principles shown in FIGS. 5 and 6, without trying to cover all mark types in a single 'compromise' illumination profile. They permit the 'ideal' illumination profile to be selected for each mark type, and so avoid rotating of field stops or substituting field stops. They also avoid expense and manufacturing difficulties associated with the axicons and matched lenses. Instead of these components, these further examples generate the off-axis spot pairs using prisms. In particular, a self-referencing interferometer of the same type as is used in the position measurement itself provides a way of generating symmetrical, coherent spot pairs from radiation having a short coherence length or time. Special techniques and/or components are presented that ensure that polarizations of the spots in each pair are both matching and selectable. These techniques will be explained.

FIG. 11 shows a schematic drawing of an apparatus usable in various modes according to mark type, polarization proposed assembly enabling off-axis illumination using a self-referencing interferometer in the illumination branch. The apparatus will be described firstly with no beams shown, only the optical axis O. Again, reference numbers for the main components of the apparatus correspond to those used in the earlier Figures, but with prefix '9' in this case for those components which are different from before. Thus an illumination subsystem 940 is seen, which has special characteristics to be described in more detail below. Components which are essentially unchanged are the beam splitter 654, objective lens 624 having a pupil plane P and self-referencing interferometer 628. Interferometer 628 splits the radiation field into two equal parts, rotates these parts by 180° relative to one another, and recombines them into an outgoing beam 682. The interferometer is drawn slightly differently compared with previous examples, but in any case this is only a two-dimensional representation of a complex three-dimensional shape. A lens 684 focuses the entire field onto detector 630, which is an arrangement similar to the known alignment sensor of FIG. 3.

FIG. 11 shows various optional features that can be provided in the apparatus. Spatial resolution at detector 630 is not required for the position measurements, but it can be provided, of course for other purposes. The FIG. 11 apparatus optionally includes an additional beam splitter 930 which diverts a fraction of the information-carrying radiation into a camera arrangement 932. This camera can record pupil plane images of the radiation, for angle-resolved scatterometry and other purposes. Another option is to include a quarter wave plate 936 between beam splitter 654 and objective 624. The function of this will be described later.

As mentioned already, the FIG. 11 apparatus is designed to implement directly selectable illumination modes having the illumination profiles illustrated in FIG. 5 or 6 at (a), (d) and (g). The illustrated example can further implement any of these profiles with alternative polarizations, and substantially without moving parts. Various components work to achieve this. First, an illumination source 942 is designed to concentrate all the available illumination into a fine spot 944 having substantially the angular and radial extents desired for the illumination profile below beam splitter 654. The position of the spot 944 is movable within an entrance pupil 954 of the optical system and can be moved or, in this example, can be selected from nine predetermined positions, referred to herein as source feed positions. These are positions labeled 1 to 8 spaced at 45° intervals around the periphery of the pupil, plus a center position. Switchable optical fibers are suitable to provide these, although a single fiber that moves physically between positions can also be envisaged. To produce all the illumination modes of FIG. 5, actually only four source feed positions are required (e.g. positions 1 to 4), as will be seen. Populating eight positions allows two alternate polarization modes to be selected without moving polarizer components, as will be described further below. The center spot is provided simply to allow on-axis illumination to be used, when desired.

The illumination emerging from the illumination source 942 may be monochromatic but is typically broadband in nature, for example white light. A diversity of wavelengths in the beam increases the robustness of the measurement, as is known. Because of its broadband nature, however, the source radiation has a short coherence length. The source feed positions 1 to 8 are not directly on the X, Y and XY axes, but rather are offset for reasons already explained with reference to FIGS. 5 and 6. They could be placed on the axes if preferred. This merely introduces a risk of interference between diffraction orders at certain combinations of wavelength and grating pitch.

Further components of the illumination system are a half wave plate 960, a prism device 962 and a modified half wave plate 964. Prism device 962 can be for example identical to the self-referencing interferometer 628, and consequently is effective to produce a coherent pair of spots diametrically opposed to one another, with positions determined by the position of the single spot selected at source 942. That is to say, radiation can be supplied at a desired pair of source regions by selecting a suitable source feed position. Prism device 962 will be referred to hereinafter as the "input interferometer" 962, to distinguish it from the interferometer 628 that processes the information-carrying radiation from the mark. Input interferometer 962 has principal axes aligned with the X and Y axes of the pupil, and is designed to perform its rotate-and-combine function when supplied with radiation at 45° polarization. Half wave plate 960 has a fast axis oriented at 22.5° to the X or Y axis, and serves to change radiation emanating from the source with an X or Y polarization into radiation with a 45° polarization. The effect of a half wave plate is nil, where the polarization of incoming light is aligned with the fast axis. Otherwise, its effect is to reflect the polarization direction in the direction of the fast axis. The plate 960 could be omitted if 45° polarized light emitted directly by suitable design of the source 942.

Modified half wave plate 964 located downstream of the input interferometer is a novel component designed specifically for this application, but potentially having wide utility. Its novel characteristic is that it has a different orientation of fast axis at different points around the optical axis. The example has in particular a split 966 such that a one half has its fast axis oriented parallel to one of the X and Y axes, while the other half has its fast axis at 45° to the X and Y axes. More generally, it is a feature of the plate 964 that the fast axis at first location is at 45° to the fast axis at a second location diametrically opposite the first location. This condition could be satisfied with more segments, but a simple split 966 in this example is sufficient. The split 966 is angled at 22.5° to the Y axis. Choosing this angle allows the split to avoid interfering with any of the source feed positions, and also facilitates the manufacture of the modified plate. Specifically, a split plate as shown can be formed from a single, uniform half wave plate by cutting it in two along a line at 22.5° to the fast axis, flipping over one of the halves, and mounting them together again. Choice of 22.5° to the Y axis is arbitrary, so long as the orientation of the fast axes is appropriate to the polarization direction of the incoming radiation, to achieve the function described more fully below. A hole 968 is formed at the optical axis, to permit on-axis illumination to pass unhindered. Of course, it is not important how the pieces are mounted together, so long as they are held somehow in position parallel with one another and suitably positions around the optical axis. In a practical embodiment, they may be cemented to a plain glass plate for support, or cemented directly to the output face of input interferometer 962.

In beam splitter 654 spot mirrors 910 are located at eight peripheral positions to serve all the desired off-axis illumination spot positions. A central spot mirror is provided to allow other modes of operation using on-axis illumination. The angular and radial extents of these spots are very small, being for example 2 to 5% of the pupil radius in extent, and similarly small in angular extent (e.g. less than 10 or less than 5 degrees, e.g. 1 to 3 degrees). In an example apparatus with a pupil diameter of 1 cm to 3 cm, for example, each spot may have a diameter of about 0.5 millimeters.

For the purposes of the explanations that follow, various planes (1) to (7) are labeled in the diagram. These are not physical components. The precise locations of these planes is immaterial, since they are located at places where all rays should be parallel.

Figure 12:
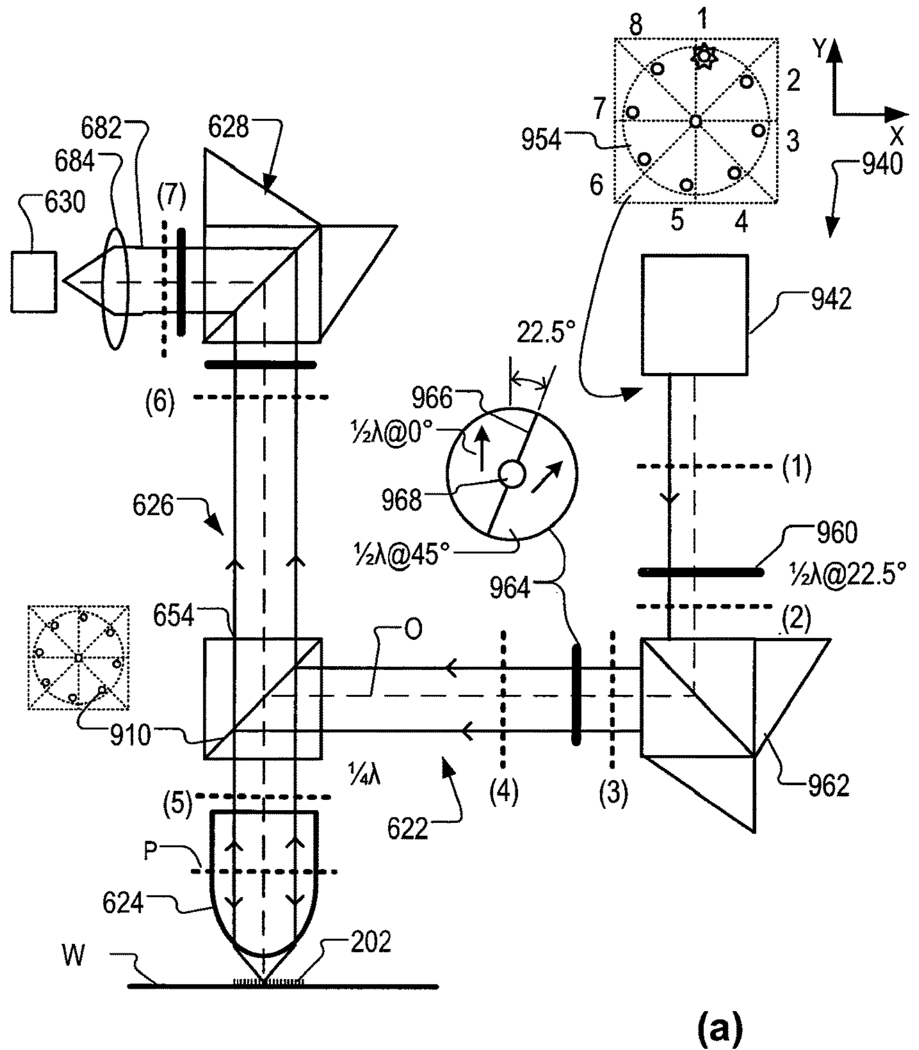
FIGS. 12 and 13 illustrate operation of the apparatus of FIG. 11 to read the position of an X direction mark with different polarizations relative to grating lines of the mark.
Figure 12:
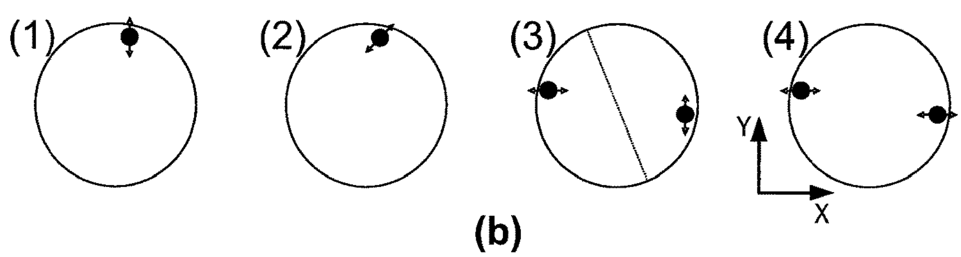

FIG. 12(*a*) illustrates the apparatus of FIG. 11 operating in a first illumination mode, where source feed position 1 is selected and illuminated. When we switch only this fiber on, we create a pupil plane as drawn in FIG. 12(*b*) at plane (1). The dot indicates the location of the illumination, and an arrow indicates the polarization direction. When the beam hits the first half wave plate 960, the polarization is rotated by 45°, as depicted at (2). Then the beam enters the input interferometer 962 where it is split into two copies, and the copies are rotated 180° relative to one another and recombined. Thus at (3) we get two rays of light, orthogonally polarized, which next hit the split half wave plate 964. The orientation of the interface 966 between separate wave plates indicated by a line in (3). The effect of a half wave plate is nil, where the polarization of incoming light is aligned with the fast axis. Otherwise, the effect is to reflect the polarization direction in the direction of the fast axis. Accordingly, where the fast axis is at 45° to incident polarization, the polarization will be rotated by 90°. The polarization of the right ray is rotated by 90° by the split half wave plate 964, while the polarization direction of the left ray remains unchanged, because its polarization is orthogonal to the fast axis. Hence at (4) an illumination profile is created which is similar to the one of FIG. 5 (*d*) that is suited to illuminate an X mark 202 with a polarization orthogonal to the grating lines.

Figure 13:
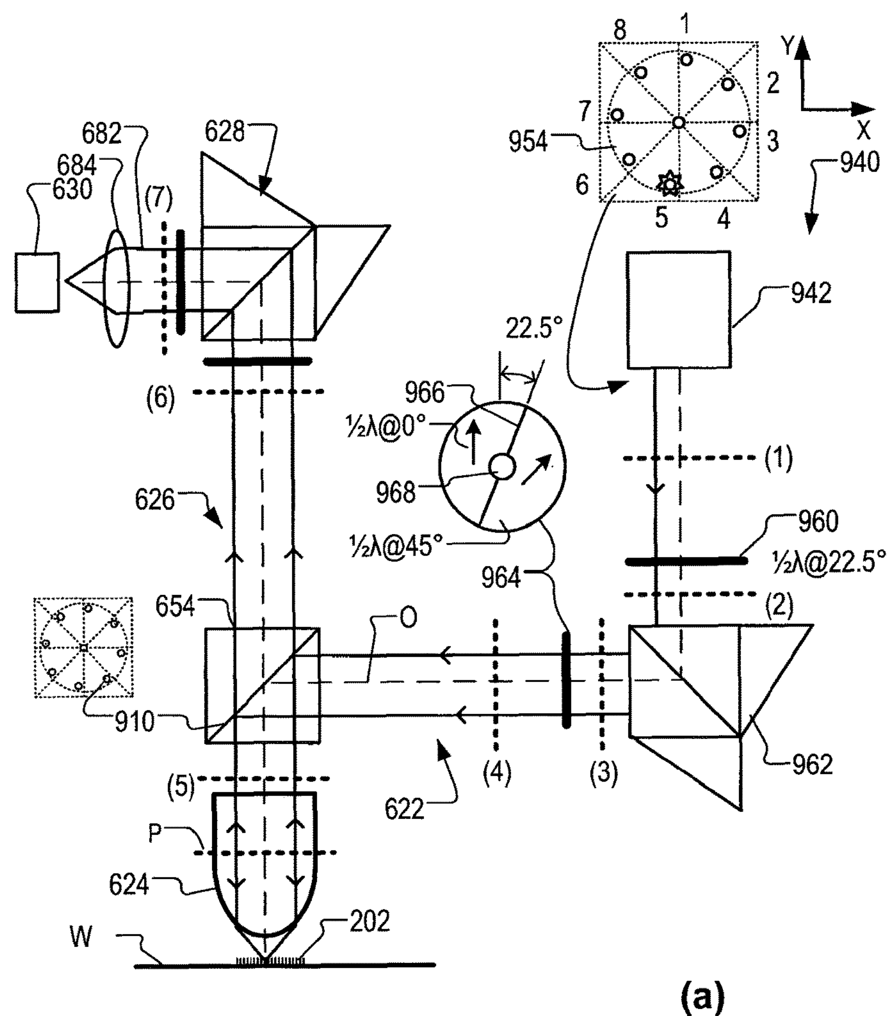

FIG. 13 shows how we can then create an illumination profile that is suited to illuminate an X mark 202 with polarization parallel to the grating lines. To do this we simply switch on the bottom fiber (source feed position 5) as drawn in FIG. 13(*a*). When we switch on the bottom fiber we create the pupil plane as drawn in FIG. 13(*b*) at (1). The arrow in the dot indicates again the polarization direction, which is the same polarization as we had at source feed position 1 (see FIG. 12(*b*) at (1)). When the beam hits the first half wave plate 960, the polarization is rotated by 45° as depicted at (2). Then the beam enters the input interferometer 962 and what comes out is drawn at (3). Again we see two rays of light, orthogonally polarized with respect to each other. Because the source feed positions 1 and 5 are diametrically opposite one another, these rays are at the same positions as in FIG. 12(*b*), but now the polarizations are orthogonal to those at (3) of FIG. 12(*b*).

When these two rays hit the split half wave plate 964 (orientation of the interface line again indicated by the line in (3)), the polarization of the right ray is again rotated by 90° by the split half wave plate 964, while the polarization direction of the left ray at (3) remains unchanged. Hence in this way an illumination mode is created that is suited to illuminate a X mark with polarization parallel to the grating lines.

From FIGS. 12 and 13, we see how the novel illumination system 940 allows us to create illumination profiles suited to a given mark in both polarizations, merely by switching the source feed position, rather than changing the polarization of the source radiation. The two spots are made from a single input ray, and are therefore coherent, even when the source radiation has a very short coherence length/coherence time.

Figure 14:
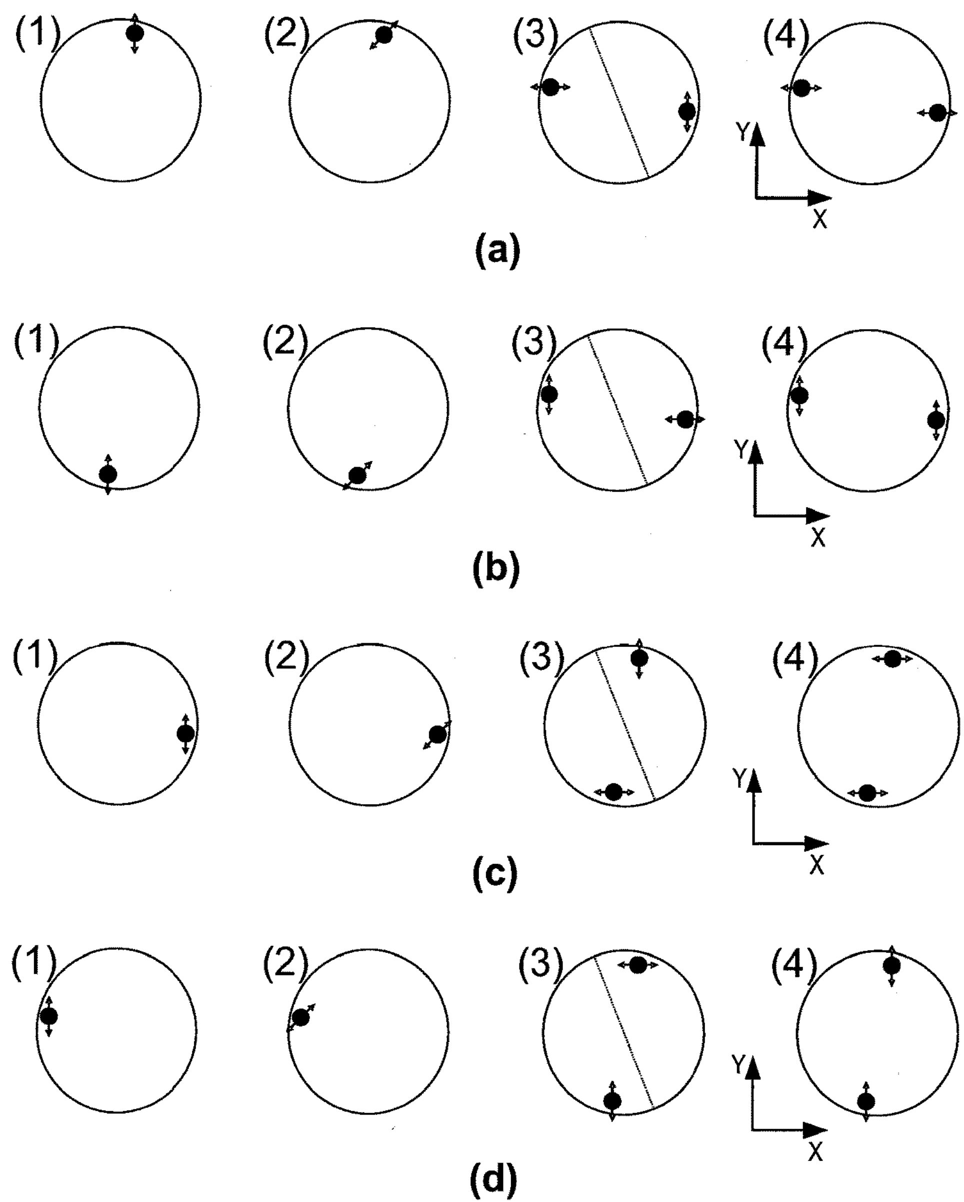
FIG. 14 illustrates the generation of eight different illumination profiles using the apparatus of FIG. 11.
Figure 14:
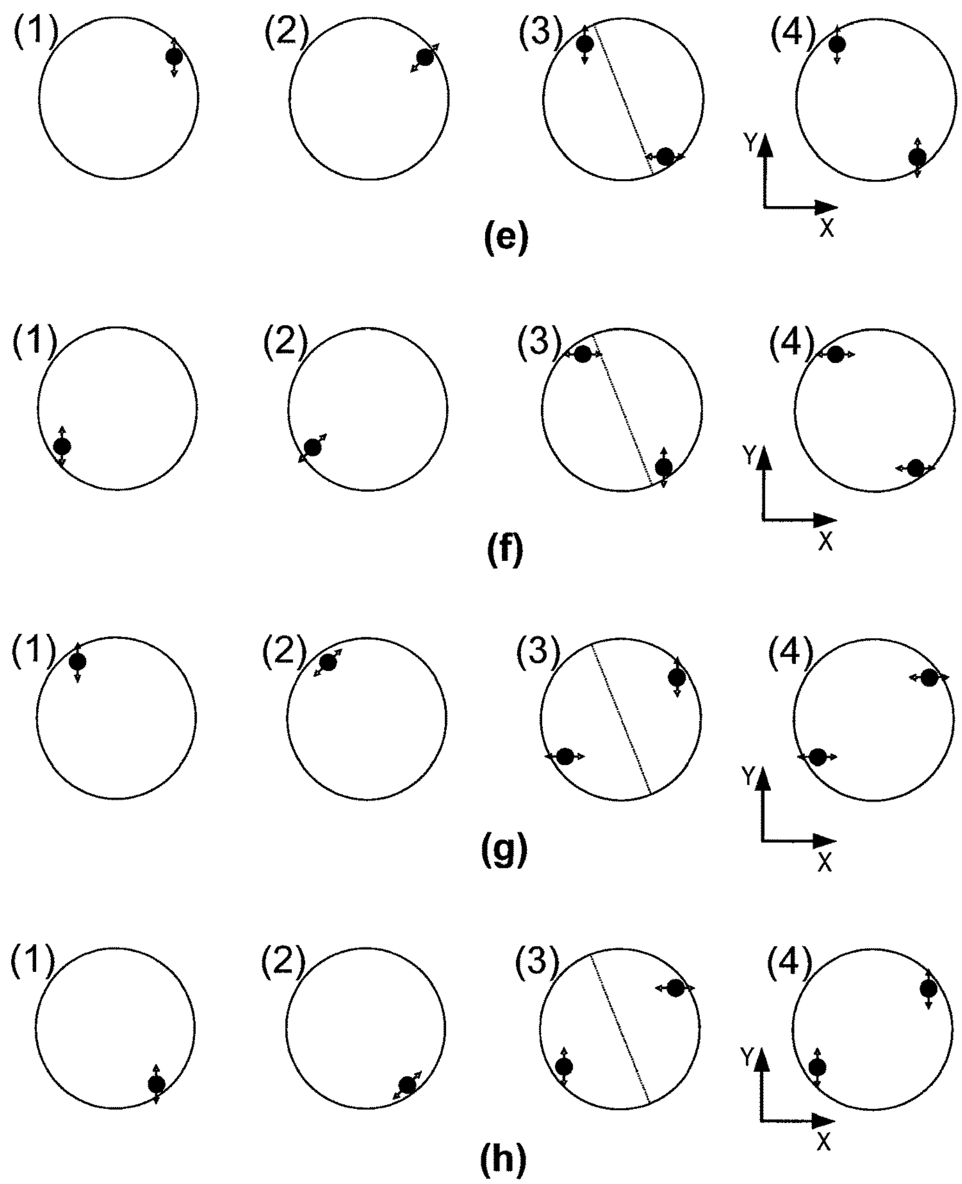

FIG. 14 shows at (a) to (h) how any of the illumination profiles suggested in FIGS. 5 and 6 can be produced, in either polarization, simply by selecting an appropriate one of the source feed positions 1 to 8. FIG. 14(*a*) corresponds to FIG. 12(*b*), and FIG. 14(*b*) corresponds to FIG. 13(*b*), these figures being repeated simply for completeness. Concerning the XY mark, two source feed positions will be activated in turn, to achieve the two pairs of spots of the illumination profile shown in FIG. 5(*g*). The selections for the different portions of the XY mark are shown in FIG. 14 at (e)/(f) and (g)/(h).

While FIGS. 11-14 show the polarization of radiation at each source feed position being set in a first plane (1) by illumination source 942 and then rotated by 45° in plane (2), it can be arranged that the polarization desired at plane (2) is already present when the radiation emerges from illumination source 942, and half wave plate 960 can be omitted. The delivery of radiation with a desired polarization at each source feed position can be arranged using optical fibers of a known type that preserve polarization of light. By mounting the fiber ends with an appropriate rotation, radiation polarized at a desired angle can be delivered to the second interferometer 962 at each of the desired source feed positions.

While it is suggested above to illuminate only one source feed position at a time, this requires the mark to be scanned more than once if it is desired for example to measure position using two different polarizations. Also it requires switching the illumination mode midway through scanning the XY mark. There are options for multiplexing the optical signals so that two measurements can be made simultaneously. Similarly, multiplexing can be applied so that different portions of the XY mark can be scanned and measured without switching illumination mode. A simple way to perform such multiplexing is by frequency division multiplexing. In this technique, radiation from each source feed position is modulated with a characteristic frequency, selected to be much higher than the frequency of the time-varying signal that carries the position information. Using such modulation, two source feed positions can be activated for example to provide illumination profiles that are the same but with different polarizations (as in FIGS. 12 and 13, for example). The diffracted and processed optical signals arriving at detector 630 will be a mixture of both polarizations, but they can be separated electronically using filters tuned to the respective frequencies of the source radiation. Time division multiplexing could also be used, but this would require accurate synchronization between source and detector. The modulation at each frequency can be a simple sine or square wave, for example.

If it is desired to illuminate a mark with circular polarization, whether for position sensing or some other form of metrology, the quarter wave plate 936 can be inserted. This was shown as an optional feature in FIG. 11 and has the effect of turning a linear polarization into a circular one (and changing it back again). The spot positions are chosen as before by activating a fiber at the correct source feed position. The direction of circular polarization (clockwise/counterclockwise) can be changed by selecting the opposite source feed position, in the same way as selecting the different linear polarizations in FIG. 14.

Figure 15:
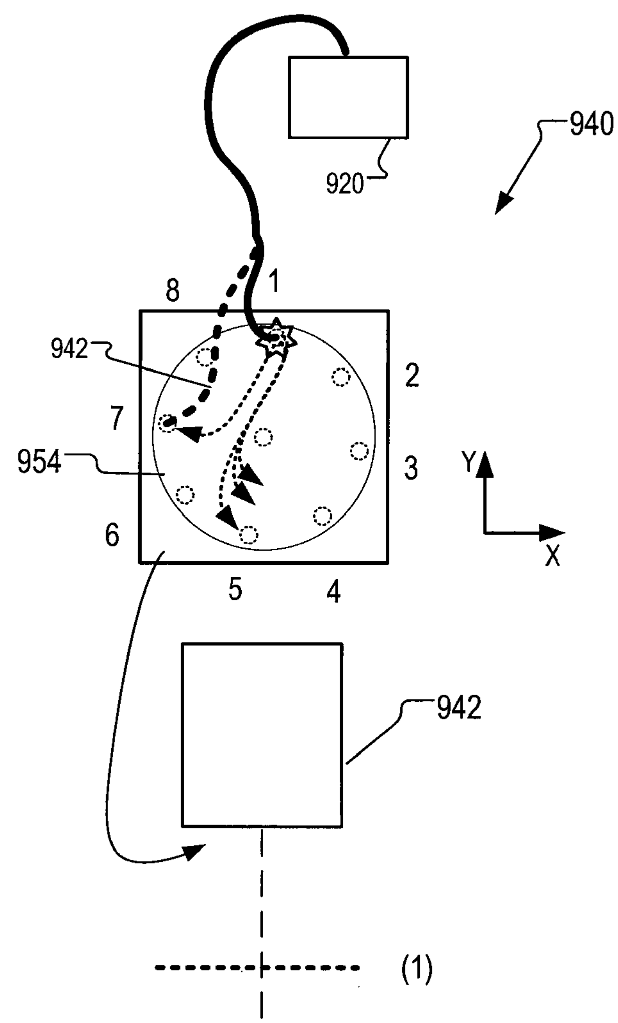
FIG. 15 illustrates a modification of the apparatus of FIG. 11.

FIG. 15 shows an alternative configuration in which a single illumination fiber is translated mechanically so as to move to a selected position in the pupil plane. This implementation has the advantage that it is possible to illuminate the grating from any angle of incidence, rather than only a predetermined selection. To allow continuously variable positions, however, the beam splitter 654 would need to be half-silvered throughout, rather than having highly reflective spot mirrors at just a few defined positions. Such an apparatus therefore needs careful implementation to avoid causing measurement errors (with consequent alignment errors in the lithographic process) and 75% of the radiation is lost by passing twice through half-silvered beam splitter.

Figure 16:
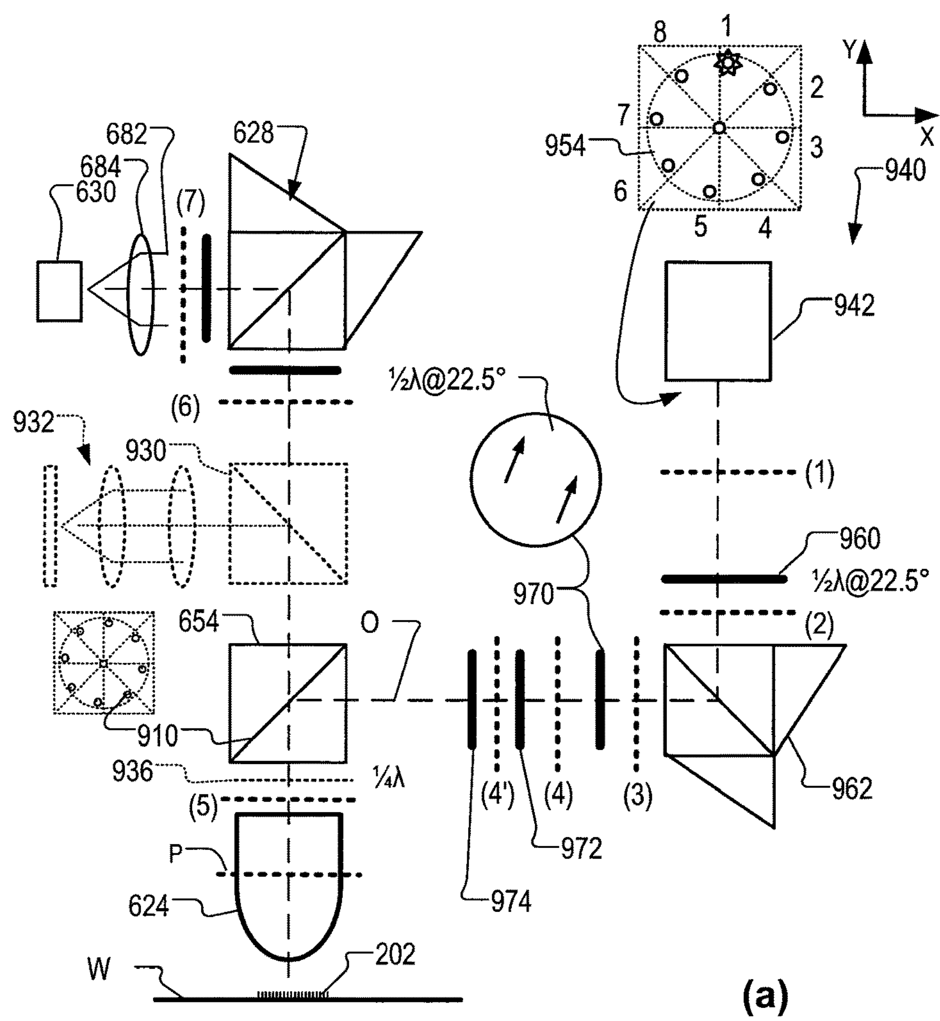
FIG. 16 is a schematic diagram of a positioning apparatus according to another modification of the apparatus of FIG. 11.
Figure 16:
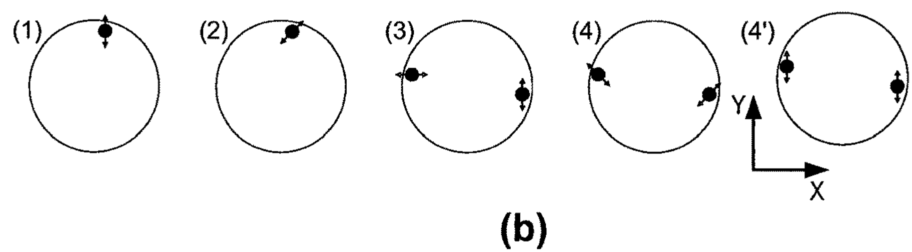

FIG. 16 shows an apparatus having the functionality of the FIG. 11 apparatus, but without the special split half wave plate 964. A simple half wave plate 970 is provided instead, with its fast axis oriented at 22.5° to the X or Y axis, as shown. Consequently, where a pair of rays emerge from the input interferometer 962 with orthogonal polarizations (at (3)), the half wave plate 970 will turn them both 45° so that their polarizations become as shown at (4). To generate the desired alternative polarizations orthogonal or parallel to the periodicity of the mark, a polarizer 972 is provided to yield the radiation field with both polarizations aligned, as shown at (4'). After this, an active element 974 is provided that can selectively rotate the polarization after the polarizer, to achieve the selectable polarization that is desired in practice. This active element can for example be a liquid crystal controlled electronically, or a half wave plate which is able to rotate.

Another alternative would be to use a polarization-neutral self-referencing interferometer, which is a variant also described in US'116. However, one then has to consider back reflection, a light loss of >50% and absorption.

Summarizing some benefits of the various novel position measuring apparatuses described above, we can say:

- Alignment marks with small pitches can be measured, without altering the existing self-referencing interferometer and detector know-how and infrastructure.
- Some 'universal' illumination profiles are demonstrated which allow for measurement of X, Y, and XY gratings without changing the illumination mode. Because of unwanted interference between diffraction orders on coarser marks, a field-stop after the interferometer should be adjustable between modes, but the alignment of this stop is less critical than the alignment of an aperture in front of the interferometer.
- Other examples provide for mark-specific illumination modes that can be selected merely by changing the source feed position, with no other moving or active parts. Using a modified half wave plate, polarizations can also be switched in this way. An alignment signal can be extracted from marks with a large range of pitches, for example from about 1 μm to around 20 μm.
- The smallest possible pitch supported for alignment marks is shortened from λ/NA to almost λ/2NA. The alignment signal obtained on small pitch alignment marks is less sensitive to mark deformation. Mark deformation is generally more dominant at the edge of the wafer. In future, when larger substrates such as 450 mm wafers are expected to be processed and measured, these edge effects may become more severe. These effects can be reduced by using small pitch alignment marks.
- The illumination profiles comprising illumination spots (more generally source regions) implemented by spot mirrors can be arranged in pairs such that the spot mirror of one spot acts as a field stop for the zero order of the opposite spot.
- A limited amount of photons are lost during the generation of the illumination profile. In some examples, virtually all the photons entering the illumination system are used.
- Adding a detector with spatial resolution, an apparatus designed primarily as an alignment sensor (i.e. for position measurement) can be extended to do pupil plane detection. This allows for angle resolved scatterometry and therefore mark reconstruction, although with a limited range of incoming angles.

Application to Asymmetry Measurement

As described so far, the position measurement apparatus is used for example to obtain an alignment position in a lithographic apparatus such as that shown in FIG. 1. An error is made when the alignment mark is asymmetric. The alignment error caused by asymmetric alignment marks contributes to the overlay error in devices made using the measurements in operation of the lithographic apparatus. By modifying the way the off-axis position measurement apparatus is operated, we can use the same hardware to measure asymmetry of the mark directly, as will shortly be explained. This raises the possibility to measure and correct the alignment error caused by asymmetry, during alignment of the lithographic apparatus.

Figure 17:
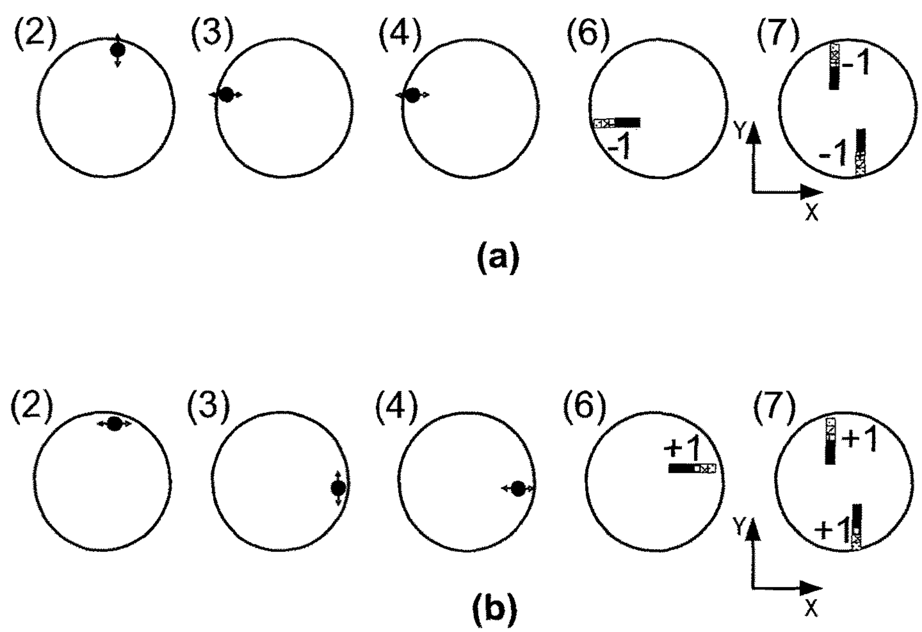
FIG. 17 illustrates illumination profiles and diffraction signals when using the apparatus of FIG. 11 to measure asymmetry in a mark.

FIGS. 17 (*a*) and (*b*) show the effect of tuning the polarization of the illumination input (source 942) at (1) in the optical system of FIG. 11, to 'turn off' the copy-and-rotate behavior of the input interferometer 962. As mentioned already, the characteristic behavior of the particular interferometer used requires the incoming ray to be polarized at 45°. Turning off the copy-and-rotate behavior leads in turn to an illumination profile in which off-axis illumination is from one side only, allowing the apparatus to measure the intensity of the +1 order and −1 order separately from one another. In FIGS. 17(*a*) and (*b*) the profiles at the various planes (2), (3), (4), (6) and (7) in the apparatus of FIG. 11 are shown for two different input polarizations. The difference between the intensity of the −1 and +1 orders is a measure for the intensity asymmetry caused by an asymmetric mark. Knowing the asymmetry allows a correction to be applied to the positions measured by the apparatus when the symmetrical illumination profiles are used on the same mark or marks that have undergone similar processing.

For the most accurate reconstruction of the alignment target we propose to use a broadband, e.g. white light source. In FIG. 17, the first orders are shown at (6) and (7) not as spots but as elongated spectra, which is the effect of the higher diffraction orders spreading according to wavelength. The input polarization direction can be tuned by adding an active component that rotates the polarization. As before, it is possible to determine the intensity asymmetry on X, Y and XY marks in a similar manner, just by choosing the appropriate source feed positions and, if necessary, an appropriate field stop. Asymmetry measurements and corrections can be made also with suitable modifications of the apparatuses of FIGS. 7 to 9, to use radiation from one of said first and second source regions at a time.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An arrangement for producing off-axis radiation at first and second positions diametrically opposed to one another in a pupil of the arrangement, the radiation at the first and second positions being identical in polarization and coherence, the arrangement comprising:

- a radiation source configured to generate radiation of a predetermined polarization at a single off-axis position;
- a self-referencing interferometer configured to receive and split the radiation from the radiation source so as to generate the radiation at the first and second positions;
- an element configured to adjust a polarization of the radiation at a first one of the first and second positions after the radiation emerges from the interferometer to match the polarization at a second one of the first and second positions, the element comprising a half wave plate whose fast axis is oriented differently at the first and second positions.

2. The arrangement of claim 1, wherein the single off-axis position is movable among a plurality of off-axis source feed positions within an entrance pupil of the apparatus to provide a plurality of off-axis illumination modes.

3. The arrangement of claim 2, wherein the plurality of off-axis source feed positions are spaced at 45° intervals around a periphery of the entrance pupil.

4. The arrangement of claim 1, wherein the arrangement includes a movable optical fiber configured to physically move so as to direct the radiation to different off-axis source feed positions.

5. The arrangement of claim 1, further comprising a plurality of switchable optical fibers each configured to direct the radiation to a different off-axis source feed position.

6. The arrangement of claim 1, wherein the radiation source is further configured to generate the radiation at an on-axis source feed position for an on-axis illumination mode.

7. The arrangement of claim 1, wherein the fast axis of the half wave plate is oriented parallel to a Y axis at the first position and the fast axis is oriented at 45° to a Y axis at the second position.

8. The arrangement of claim 7, wherein the half wave plate is split into two segments angled at 22.5° to the Y axis.

9. The arrangement of claim 1, wherein the half wave plate comprises a hole formed at an optical axis to permit on-axis radiation to pass unhindered.

10. The arrangement of claim 1, wherein the apparatus is configured to measure positions of marks on a substrate, the apparatus further comprising:

- an objective lens configured to form a spot of radiation on one of the marks using radiation supplied by the arrangement while scanning the spot of radiation across the mark in a scanning direction;
- a second self-referencing interferometer configured to process radiation that is diffracted by the mark and re-enters the objective lens; and
- a detector configured to detect variations in an intensity of radiation output by the second self-referencing interferometer during the scanning and to calculate from the detected variations a position of the mark in at least a first direction of measurement.

11. The arrangement of claim 1, wherein the radiation source is a broadband radiation source configured to generate white light.

12. An arrangement configured to produce off-axis radiation at first and second positions diametrically opposed to one another in a pupil of the arrangement, the radiation at the first and second position being identical in polarization and coherent, the arrangement comprising:

- a radiation source configured to generate the radiation for a plurality of predetermined polarizations, each at a single off-axis position;
- a self-referencing interferometer configured to receive and split the radiation from the radiation source so as to generate the radiation at the first and second respective positions;
- an element configured to adjust a polarization of the radiation at one of the first and second positions after the radiation emerges from the self-referencing interferometer to match the polarization at another one of the first and second positions, the element comprising a half wave plate whose fast axis is oriented differently at the first and second positions.

13. The arrangement of claim 11, wherein the single off-axis position is movable among a plurality of off-axis source feed positions within an entrance pupil of the arrangement to provide a plurality of off-axis illumination modes.

14. The arrangement of claim 11, wherein the radiation source is further configured to multiplex the radiation of the plurality of predetermined polarizations to provide simultaneous illumination at a plurality of illumination modes.

15. The arrangement of claim 13, wherein the radiation source is further configured to multiplex by frequency division multiplexing.

16. The arrangement of claim 13, wherein the radiation source is further configured to multiplex by time division multiplexing.

17. The arrangement of claim 11, wherein the fast axis of the half wave plate is oriented parallel to a Y axis at the first position and the fast axis is oriented at 45° to a Y axis at the second position.

18. The arrangement of claim 11, wherein the half wave plate is split into two segments angled at 22.5° to the Y axis.

19. The arrangement of claim 11, wherein the half wave plate comprises a hole formed at an optical axis to permit on-axis radiation to pass unhindered.

20. The arrangement of claim 11, wherein the apparatus is configured to measure positions of marks on a substrate, the apparatus further comprising:

an objective lens configured to form a plurality of spots of radiation on one of the marks using radiation supplied by the arrangement while scanning the spot of radiation across different portions of the mark in a scanning direction;

a second self-referencing interferometer configured to process radiation that is diffracted by the mark and re-enters the objective lens; and a detector configured to electronically separate the processed radiation according to a respective illumination mode, to detect variations in an intensity of radiation output by the second self-referencing interferometer during the scanning, and to calculate from the detected variations a position of the mark in at least a first direction of measurement.

* * * * *